(12) United States Patent
Byun

(10) Patent No.: US 7,485,339 B2
(45) Date of Patent: *Feb. 3, 2009

(54) METHOD FOR CHEMICAL VAPOR DEPOSITION CAPABLE OF PREVENTING CONTAMINATION AND ENHANCING FILM GROWTH RATE

(76) Inventor: Chulsoo Byun, 2-709 Seorin Apt. 869 Dogok-1-dong, Kangnam-gu, 135-857 Seoul (KR)

( * ) Notice: Subject to any disclaimer, the term of this patent is extended or adjusted under 35 U.S.C. 154(b) by 125 days.

This patent is subject to a terminal disclaimer.

(21) Appl. No.: 11/602,523

(22) Filed: Nov. 21, 2006

(65) Prior Publication Data

US 2007/0065599 A1    Mar. 22, 2007

Related U.S. Application Data

(62) Division of application No. 10/267,208, filed on Oct. 9, 2002, now Pat. No. 7,156,921.

(30) Foreign Application Priority Data

Oct. 18, 2001 (KR) .......................... 10-2001-64337
Feb. 7, 2002 (KR) .......................... 10-2002-06957

(51) Int. Cl.
*C23C 16/00* (2006.01)
(52) U.S. Cl. .............................. 427/248.1; 427/255.23; 118/715
(58) Field of Classification Search .............. 427/248.1, 427/255.23; 118/715, 719, 728
See application file for complete search history.

(56) References Cited

U.S. PATENT DOCUMENTS

| 4,661,199 A | * | 4/1987 | Looney et al. ................ 117/96 |
| 4,684,542 A | * | 8/1987 | Jasinski et al. .............. 438/680 |
| 4,753,192 A | | 6/1988 | Goldsmith et al. |
| 5,273,588 A | | 12/1993 | Foster et al. |
| 5,439,524 A | | 8/1995 | Cain et al. |
| 5,540,800 A | | 7/1996 | Qian |
| 5,792,261 A | | 8/1998 | Hama et al. |
| 5,814,561 A | | 9/1998 | Jackson |
| 5,851,589 A | | 12/1998 | Nakayama |
| 5,953,630 A | | 9/1999 | Maeda et al. |
| 6,033,480 A | | 3/2000 | Chen |

(Continued)

FOREIGN PATENT DOCUMENTS

JP    60-0340101    2/1985

(Continued)

OTHER PUBLICATIONS

Deng, Xunming et al., "Hot-wire deposition of amorphous and microcrystalline silicon using different gas excitations by a coiled filament". Thin Solid Films, vol. 430, Issues 1-2, Apr. 22, 2003, pp. 304-308.*

*Primary Examiner*—Bret Chen
(74) *Attorney, Agent, or Firm*—Volpe and Koenig, P.C.

(57) ABSTRACT

A method for chemical vapor deposition (CVD) comprises injecting a purge gas into a reaction chamber where substrates are located; and supplying a source material of vapor phase participating directly in forming a film on the substrates to an inside of the reaction chamber, thus forming a protective curtain in the inside of the reaction chamber by a mutual diffusion-suppressing action between the purge gas and source material.

7 Claims, 28 Drawing Sheets

U.S. PATENT DOCUMENTS

| | | |
|---|---|---|
| 6,096,135 A | 8/2000 | Guo |
| 6,097,133 A | 8/2000 | Shimada |
| 6,113,705 A | 9/2000 | Ohashi |
| 6,301,434 B1 * | 10/2001 | McDiarmid et al. ......... 392/416 |
| 6,444,039 B1 | 9/2002 | Nguyen |
| 2006/0263522 A1 * | 11/2006 | Byun ...................... 427/248.1 |

FOREIGN PATENT DOCUMENTS

| | | |
|---|---|---|
| JP | 1-187809 | 7/1989 |
| JP | 1-286306 | 11/1989 |
| JP | 06-163439 | 6/1994 |
| JP | 09-283459 | 10/1997 |
| JP | 11-200035 | 7/1999 |
| KR | 1998-052922 | 9/1998 |

* cited by examiner

PRIOR ART

PRIOR ART

METHOD FOR CHEMICAL VAPOR DEPOSITION CAPABLE OF PREVENTING CONTAMINATION AND ENHANCING FILM GROWTH RATE

CROSS REFERENCE TO RELATED APPLICATION

This application is a divisional application of U.S. patent application Ser. No. 10/267,208 filed on Oct. 9, 2002, which issued on Jan. 2, 2007 as U.S. Pat. No. 7,156,921, which is incorporated by reference as if fully set forth.

BACKGROUND OF THE INVENTION

1. Field of Invention

The present invention relates in general to a method and apparatus for chemical vapor deposition (CVD), and more particularly to a method and apparatus for CVD that prevents contamination and enhancing film growth rate by directing a reactive gas for forming a film to the midst of a reaction chamber, and concentrating the reactive gas diffused over a susceptor in the chamber to prevent the reactive gas from being touching components of the reaction chamber.

2. Description of the Related Art

Chemical vapor deposition (CVD) is a thin film deposition process for forming solid material over the surface of a substrate using a reactant (usually in the form of gas, i.e., a reactive gas). As depicted in FIG. 1, a conventional apparatus for CVD comprises in general a reaction chamber 3 producing a vacuum, an inlet 7 for supplying the reactive gas to the chamber 3, a heating means 44 for chemically reacting the reactive gas supplied, outlets 6 for discharging exhaust gas, and a susceptor 5, located in the midst of the chamber 3, on which a substrate 55 is placed and the deposition occurs. When a given composition of vapor phase, including a main source material that participates directly in forming films and an auxiliary source material for carrying, vaporizing or diluting the main source material, is injected into the vacuum chamber 3, the composition is diffused instantly in all directions, such that the density of the reactive gas may have finite value at all over the inside of the reaction chamber. Especially, a portion of the composition in the vicinity of the susceptor is excited by hot temperature of the susceptor to form films on the substrate.

The conventional CVD apparatus is mainly used for making thin films less than 3 μm in thickness due to a low growth rate. To form a thick film more than 3 μm in thickness, it is necessary to increase the density of the reactive gas in the chamber considerably. However, the reactive gas injected into the chamber 3 generates undesired films or powders on the reaction chamber components such as walls, reactive gas distributing showerheads, substrate heating devices, inspection windows, etc. Moreover, the undesired films and/or powders formed on the reaction chamber components are broken to be small particles by repeated thermal expansion/contraction and/or lattice parameter mismatch between the reaction chamber components, thus contaminating the thin films while manufacturing. Here, if the number of the contaminant particles in the chamber 3 is increased, the reliability of the manufacturing process is deteriorated seriously. For example, in case of making very large scale integration (VLSI), the contaminant particles result in serious pattern inferiority such as circuit short.

Meanwhile, to enhance film growth rates in the conventional CVD system, it is necessary to increase the density of the reactive gas in the vicinity of the susceptor by adding the reactive gas to all space of the chamber 3 in practice, which requires the amount of the reactive gas excessively, thus deteriorating the economic efficiency.

To prevent contamination and undesired deposits in the reaction chamber 3, it may be considered to regulate the chamber temperature appropriately. However, the range of the temperature regulatable is very narrow, and furthermore, if the reactive gas is composed of several source materials, the range of temperature to regulate doesn't exist actually. Consequently, it is impossible to prevent generation of contaminant particles by regulating the reaction chamber temperature.

Besides, in the conventional CVD system, the temperature difference between the inner wall of the chamber 3 and the susceptor 5 causes a natural convection, which makes it difficult to maintain the diffusion of the reactive gas uniformly onto the substrates, thus deteriorating the reliability of the films formed. Moreover, the natural convection makes the contaminant particles generated continue to re-circulate in the chamber, which aggravates the problem of the contamination.

Accordingly, to manufacture a thick film more than 3 μm in thickness or VLSI circuits rapidly and economically, it is required to provide an improved method and apparatus for CVD that can prevent contamination, even when highly concentrated reactive gas is injected into the reaction chamber, and increase the density of the reactive gas in the vicinity of the susceptor in the reaction chamber considerably without raising the amount of the reactive gas supplied.

Following two conventional methods relate to the methods for increasing the density of the reactive gas in the vicinity of the susceptor in the chamber 3, and preventing generation of contaminant particles, respectively, which are considered as prior arts of the present invention.

First, as depicted in FIG. 2, U.S. Pat. No. 5,851,589 describes a CVD apparatus including a first gas, containing a reactive gas, fed in parallel to the surface of the substrate 55 through a pipe 2, and a second gas, containing a purge gas (non-reactive-gas), blown perpendicularly towards the surface of the substrate 55 through a injecting plate 1 to stabilize and make laminar flowing state of the first gas. Next, referring to FIG. 3, U.S. Pat. No. 6,301,434 discloses a dual gas manifold providing purge gas through a top showerhead 6 to prevent deposits on the window 8 and providing reactive gas through a lower showerhead 7 to deposit films on the substrate 55. The prior arts described above positively employed the control of purge gas to relax the conventional contamination problem. However, it seems that relaxation of the contamination is done only at the limited portion of the whole reaction chamber in both prior arts cited.

In FIG. 2, there exists an unavoidable re-circulation zone near the leading edge of the substrate, and it is difficult to suppress the diffusion of the reactive gas to the chamber wall, which deteriorates the effectiveness of the reference system. Moreover, the external control of purge gas flow rate may need much trial to make the reactive gas flow stabilized, since the laminar flow zone of the reactive gas is very narrow while the purge gas suppresses the narrow zone overall perpendicularly, thereby involving the latent instability of the flow. In FIG. 3, although the purge gas control system may be effective in preventing deposits on the window of the lamp system, it is not sure whether the reference apparatus could prevent particles being formed on the surface of the reaction chamber components such as chamber walls, especially around the areas far away from the purge gas showerhead. This problem would become serious when long process time and/or high growth rate is required.

Accordingly, the present invention is invented to provide a method and apparatus for chemical vapor deposition, which eliminates the drawbacks of the above-mentioned prior art. That is, the method and apparatus for CVD can form efficiently thick films more than 3 μm in thickness of high quality with excellent reproducibility, uniformity, controllability, and high growth rate using a protective curtain formed by a mutual diffusion-suppressing action between the purge gas and reactive gas.

BRIEF SUMMARY OF THE INVENTION

Accordingly, it is an object of the present invention to provide a method for CVD comprising steps of injecting a purge gas, which doesn't either dissolve or generate byproducts by itself, into a reaction chamber where substrates are placed introducing the purge gas into the inside of the reactive gas confining means having plural openings; and supplying a source material of vapor phase participating directly in forming a film on the substrates to an inside of the reaction chamber, thus forming a protective curtain in the inside of the reaction chamber by a mutual diffusion-suppressing action between the purge gas and source material. According to the method for CVD of the invention described above, it is possible to increase the density of source material substantially only in the vicinity of the substrates and enhance film growth rate remarkably.

It is a further object of the present invention to provide a method for CVD comprising steps of: establishing a reactive gas confining means, having a plurality of openings, in a reaction chamber; injecting a purge gas, which doesn't either dissolve or generate byproducts by itself, into an outside of the reactive gas confining means; and supplying a source material of vapor phase participating directly in forming a film to an inside of the reactive gas confining means, thus dividing an inside of the reaction chamber into a first region where a density of the source material is high and a second region where the density of the source material is extremely low.

Another object of the present invention is to provide the method for CVD described above, wherein the reactive gas confining means has a plurality of openings through which the purge is introduced to the inside of the reactive gas confining means, thus preventing the source material from diffusing to the outside of the reactive gas confining means, and forming a protective curtain that prevents the source material from touching the reactive gas confining means.

An additional object of the present invention is to provide the method for CVD described above, wherein an amount of the purge gas injected to the outside of the reactive gas confining means is set much larger than that of the source material supplied to the inside of the reactive gas confining means to direct the protective curtain of purge gas from the outside to the inside of the reactive gas confining means, thus preventing the source material from touching the reactive gas confining means.

Yet another object of the present invention is to provide an apparatus for CVD, including a susceptor located in a reaction chamber producing a vacuum, on which substrates are placed and a film deposition process is made, the apparatus comprising: a reactive gas confining means, established over the susceptor, having at least a source material supply port through which a source material is supplied and a plurality of openings perforated on a surface thereof; a purge gas supply port through which a purge gas is fed into an outside of the reactive gas confining means; and an exhaust port for discharging exhaust gasses generated in the reaction chamber.

Still another object of the present invention is to provide an apparatus for CVD including a boat, established in a reaction chamber in a horizontal direction, on which a plurality of wafers are placed, the apparatus comprising: a reactive gas confining means, provided in a horizontal direction to envelop the boat, having a plurality of openings perforated on a surface thereof, a source material supply means on one end thereof and an exhaust port for discharging byproducts on the other end thereof, thus forming a protective curtain in an inside of the reaction chamber by a mutual diffusion-suppressing action between a purge gas injected to an outside of the reactive gas confining means and a source material supplied to an inside of the reactive gas confining means.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
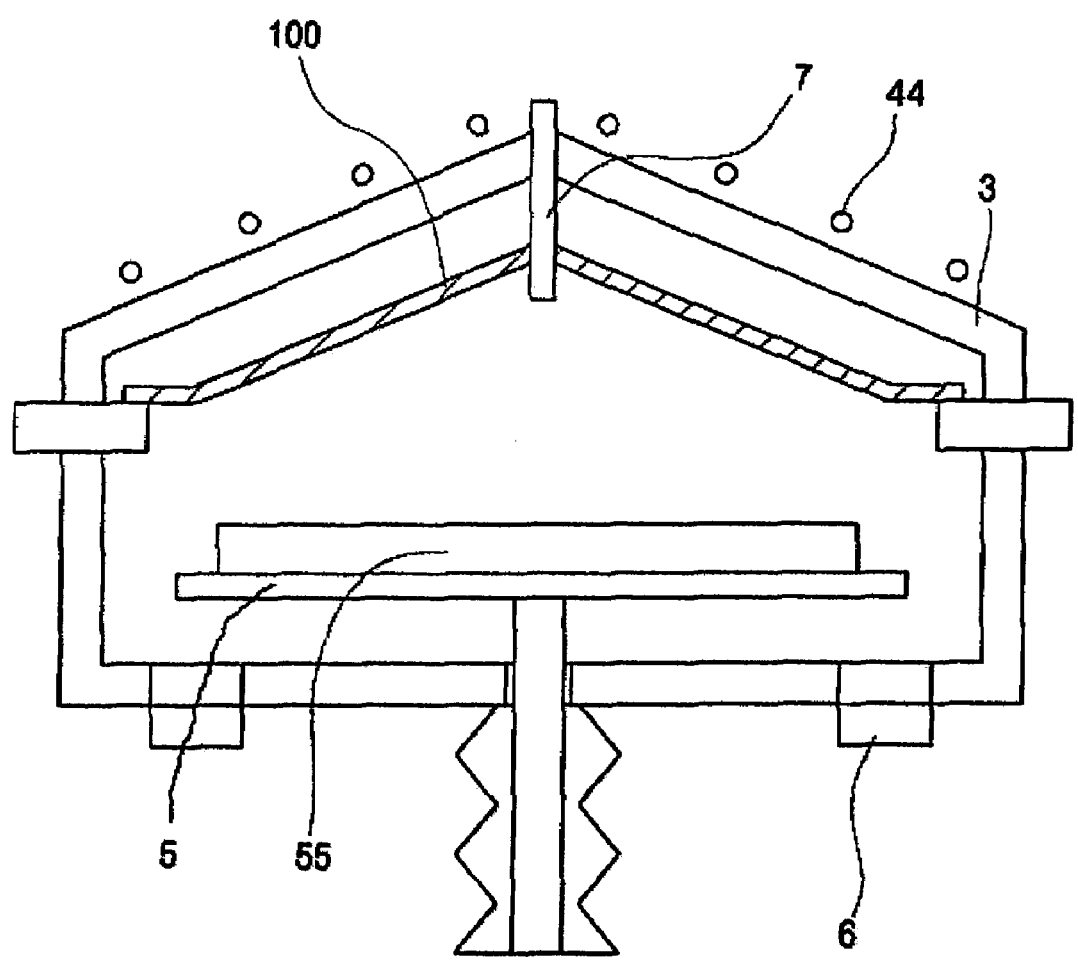
FIGS. 1, 2 and 3 are schematic views showing various types of conventional CVD apparatus.
Figure 2:
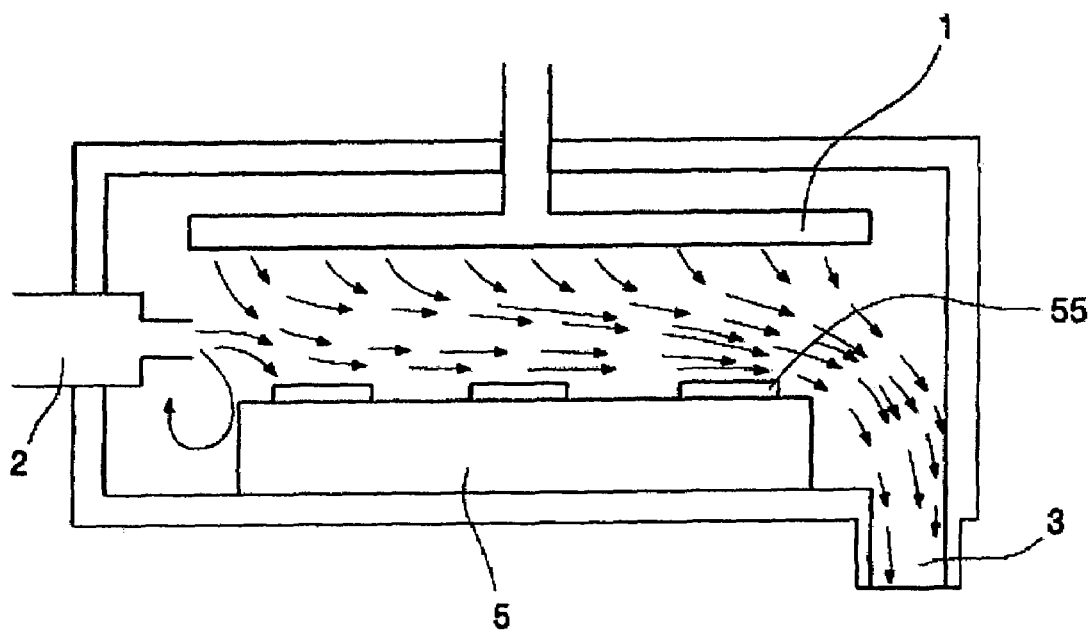
Figure 3:
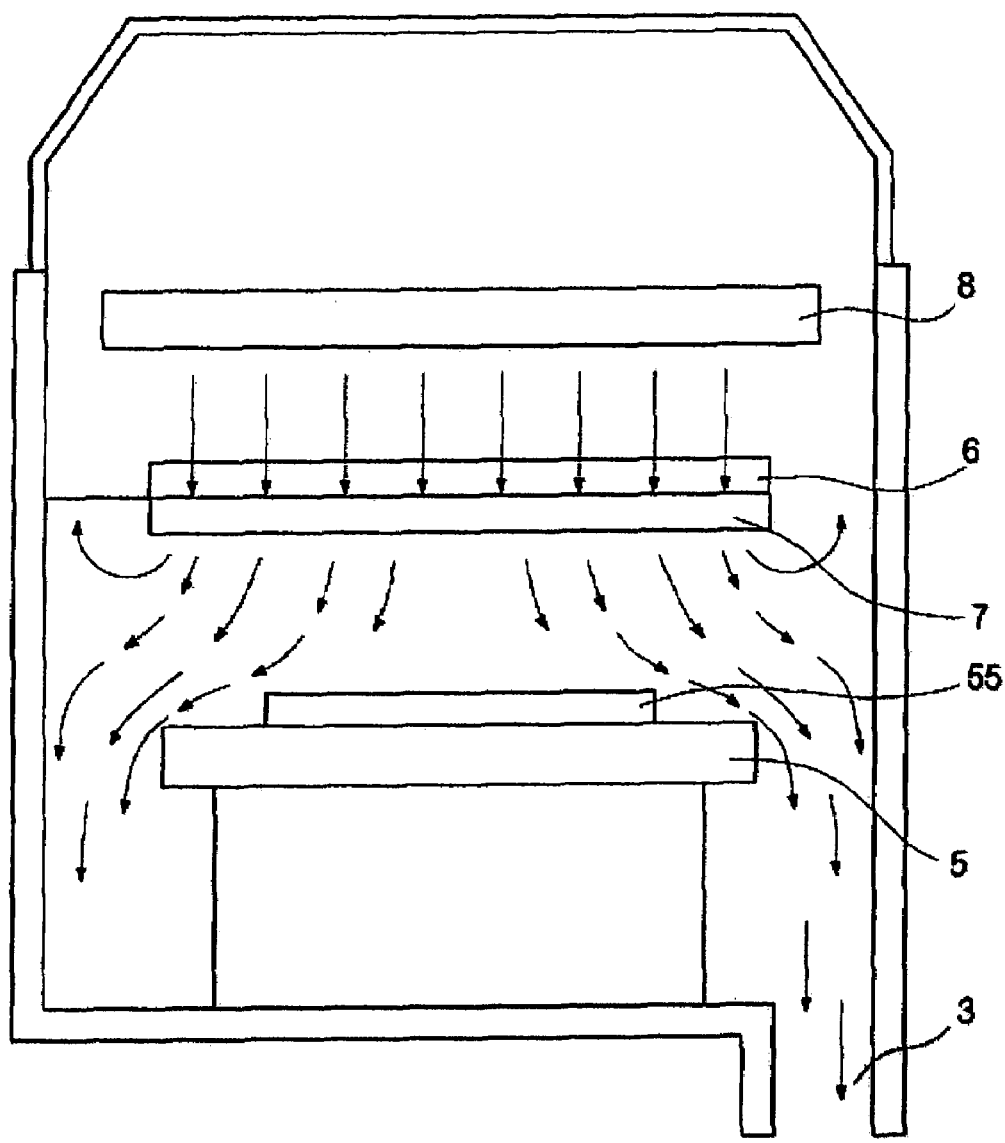
Figure 4:
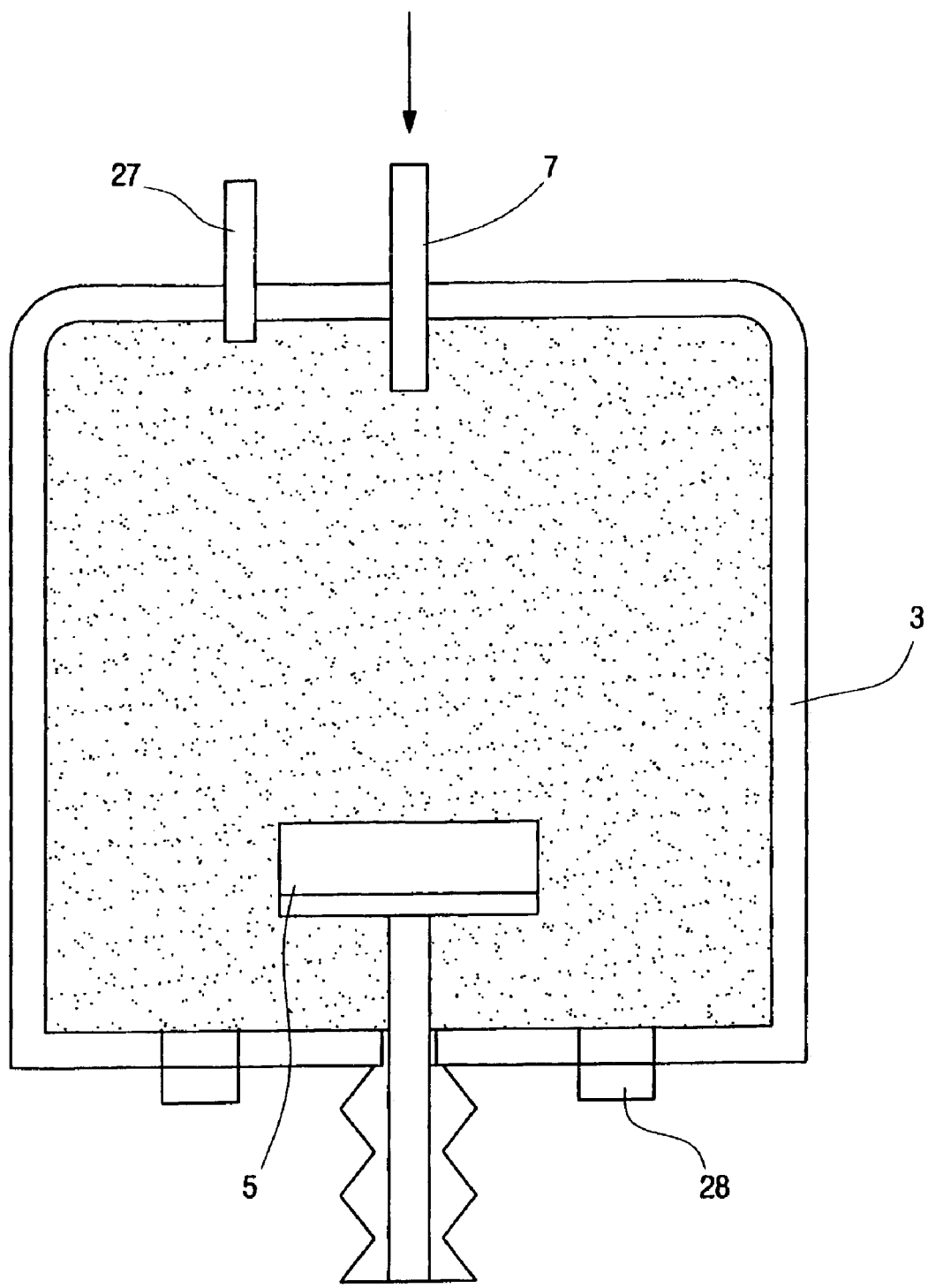
FIG. 4 is a conceptional view showing a reaction chamber where a reactive gas for depositing films is filled up.
Figure 5:
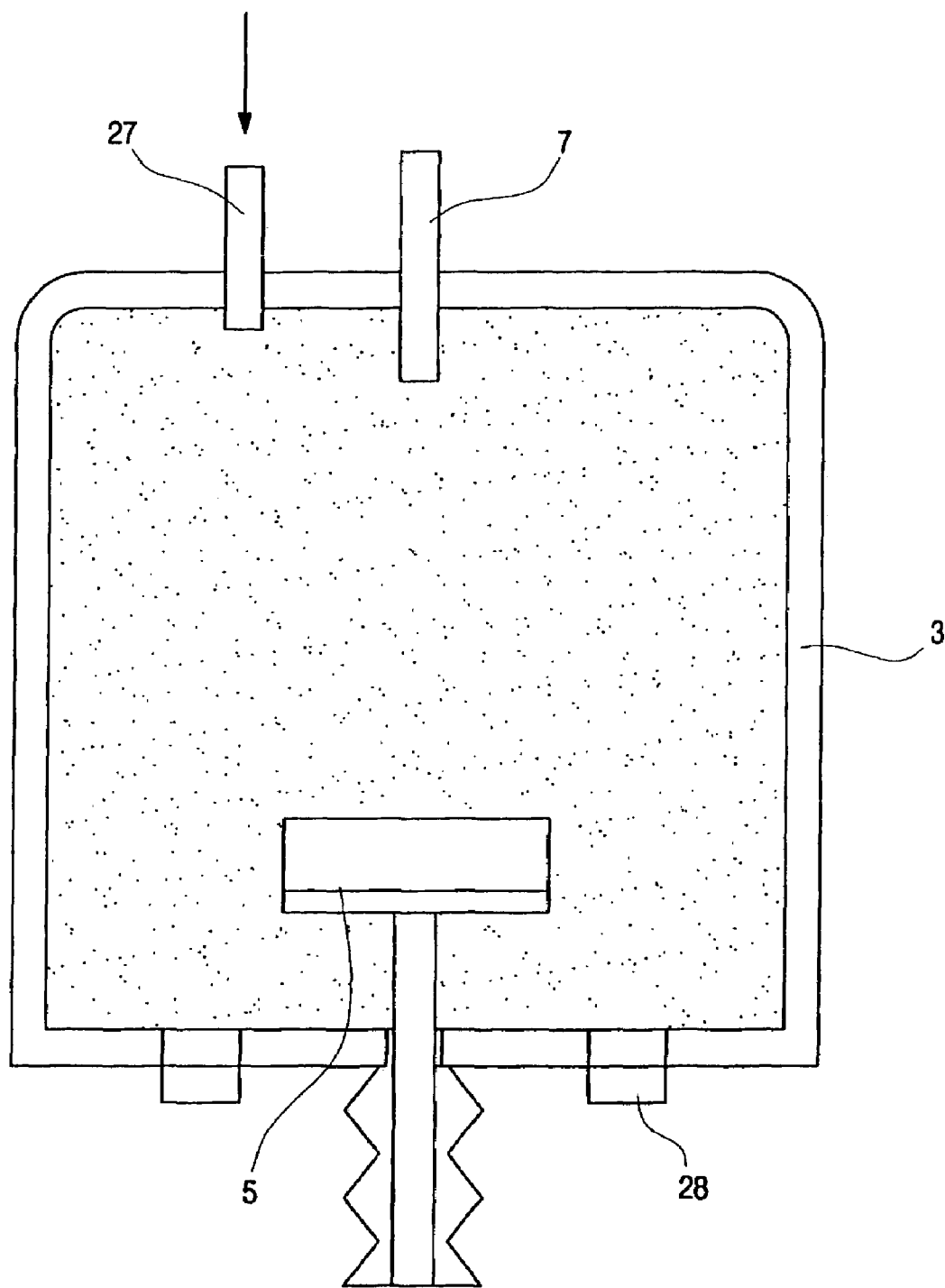
FIG. 5 is a conceptional view showing a reaction chamber where a purge gas is filled up.
Figure 6:
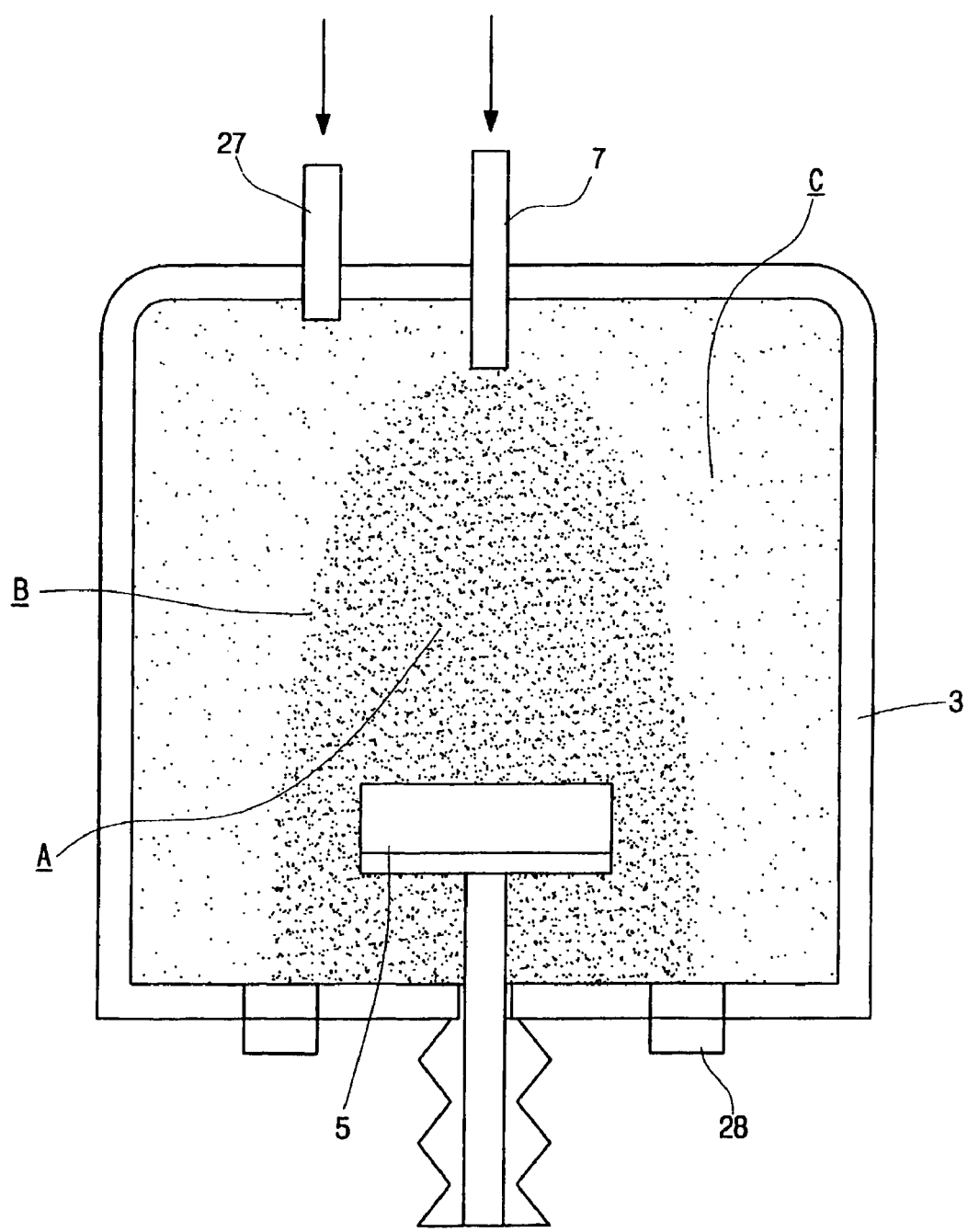
FIG. 6 is a conceptional view depicting the status that the reactive gas is confined in the midst of the chamber where a purge gas is filled up.

Referring to FIGS. 4 to 6, there are provided a purge gas supply port 27 through which a purge gas is fed into a reaction chamber 3, a reactive gas supply port 7 through which a reactive gas is supplied into the chamber 3, a susceptor 5 for supporting and heating the substrate and an exhaust port 28 for discharging byproducts in the chamber 3. When a predetermined reactive gas is injected into the chamber 3 of low pressure, the reactive gas is diffused instantly in all directions; likewise, the purge gas fed into the chamber 3 is diffused instantly in all direction. However, as depicted in FIG. 6, when the reactive gas is supplied into the midst of the chamber 3 where the purge gas is filled up, there is formed a protective curtain B between the reactive gas and purge gas filled up due to a mutual diffusion-suppressing action, thus dividing the interior space of the chamber 3 into two portions A and C.

The purge gas doesn't either dissolve or generate byproducts by itself in the chamber 3. For example, the purge gas includes Ar, He, $H_2$, $N_2$ etc. as a carrier gas, Ar, $N_2$ as a dilution gas, and $O_2$ which doesn't generate byproducts by itself. The purge gas of small molecular weight, which diffuses instantly, is relatively little influenced by the act of vacuum pumping.

Meanwhile, the reactive gas is a source material of vapor phase that participates directly in forming the film; a mixture of vapor phase containing a main source material and an auxiliary source material for carrying, vaporizing or diluting the main source material; or a pure main source material of vapor phase without carrier gas for carrying the main source material. In this regard, the Korean Patent No. 225592 teaches a method for vaporizing and delivering such reactive gas without the aid of carrier gas in a metal-organic chemical vapor deposition process (MOCVD).

According to the present invention, when the purge gas and the reactive gas are supplied separately into the reaction chamber 3, the reactive gas is highly concentrated at a region proximate to the susceptor 5 located in the midst of the chamber 3 (portion A), whereas the purge gas gathers in the vicinity of the inner wall of the chamber 3 (portion C). That is, when the reactive gas is fed into the midst of the chamber 3 where the purge gas is filled up in advance, there is formed a protective curtain B. which divides the interior space of the chamber 3 into two portions A and C, having different density distributions with each other. Accordingly, it is possible to increase the film growth rate with the increase of the reactive gas density, and to prevent generation of contaminant particles on the inner wall of the chamber 3, since the reactive gas doesn't exist over the inner wall of the chamber 3. However, a minute temperature difference between the inner wall of the chamber 3 and the susceptor 5 may cause a natural convection, which makes it very difficult to maintain the protective curtain B stably. That is, the protective curtain B is ready to get broken by the natural convection or variations of the amount of the two gasses supplied. Consequently, it is hard to adopt the method using the unstable protective curtain B to the chemical vapor deposition that needs precision, uniformity and high growth rate.

Figure 7:
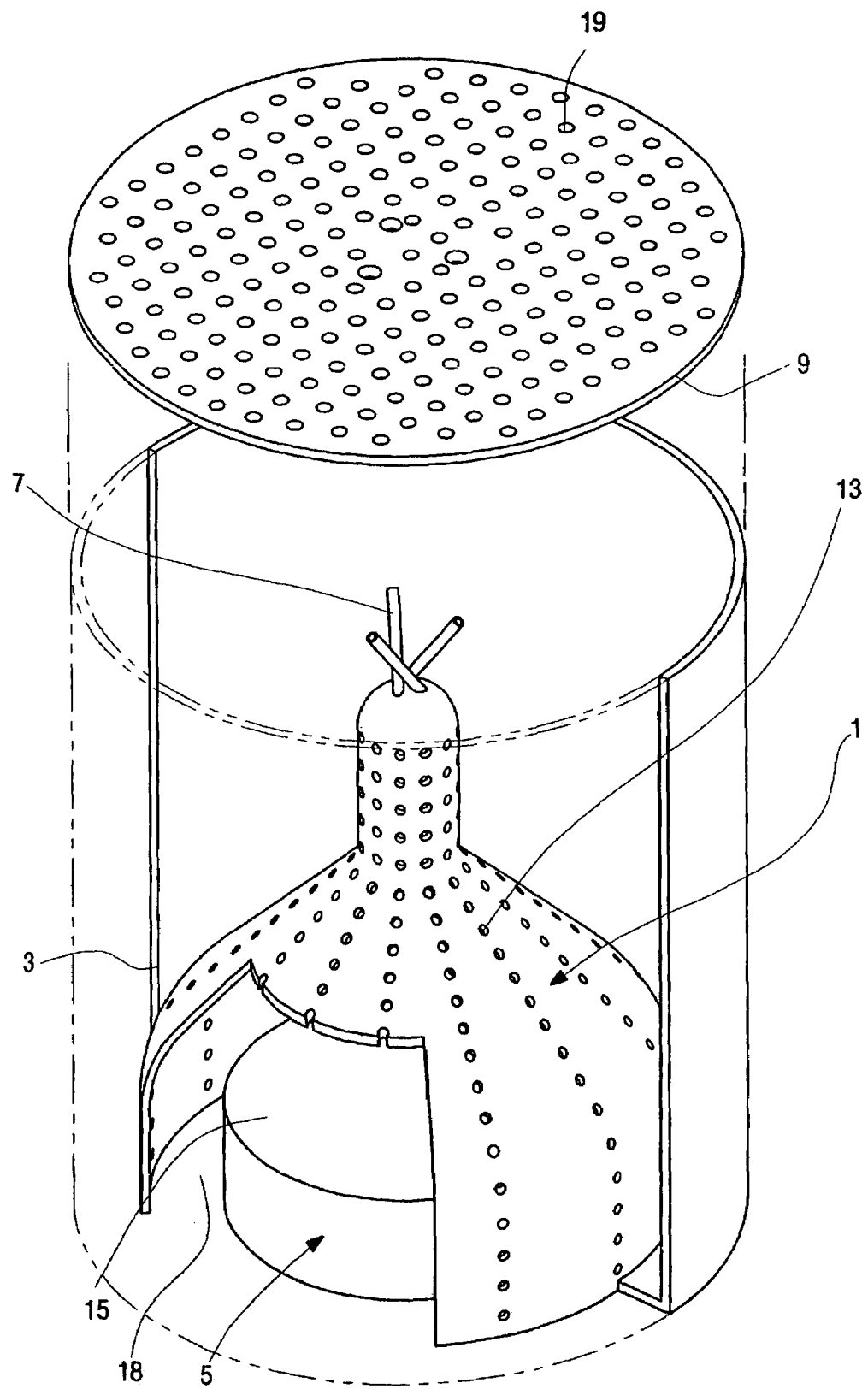
FIG. 7 is a partially cut perspective view illustrating a basic concept of a reaction chamber of a CVD apparatus in accordance with a preferred embodiment of the present invention.

To overcome the problem described above, the present invention provides a reactive gas confining means 1 as an auxiliary means for keeping the protective curtain B stably. As depicted in FIG. 7, the reactive gas confining means 1 is established in the midst of the chamber 3. The means 1 has a proper volume and type capable of surrounding the protective curtain B therein. Reactive gas supply ports 7 are provided on the top of the means 1, a showerhead 9 through which the purge gas passes into the chamber 3 is established over the means 1, and a susceptor 5 on which substrates are placed is provided within the means 1. Besides, an exhaust port 18 for discharging byproducts is located between the susceptor 5 and the means 1.

The reactive gas confining means 1, established a little bit outside based on the protective curtain to be formed desirably between the purge gas and the reactive gas, prevents the protective curtain from being broken by complementing the mutual diffusion-suppressing action between the two gasses, thus protecting and keeping the protective curtain stably. That is, when the purge gas is fed into the chamber 3 through a purge gas supply port, not depicted, the purge gas is readily diffused to the inside of the means 1 through a plurality of openings 13 perforated on the surface of the means 1. Next, when the reactive gas is supplied to the inside of the means 1 through the reactive supply ports 7, the reactive gas concentrated within the means 1 presses the purge gas outwardly, thus forming a predetermined protective curtain. Contrarily, a portion of the purge gas is forced to diffuse to the inside of the means 1 through the openings 13, thus strengthening the protective curtain to be kept stably, regardless of the natural convection or variations of the purge gas flow.

Figure 8:
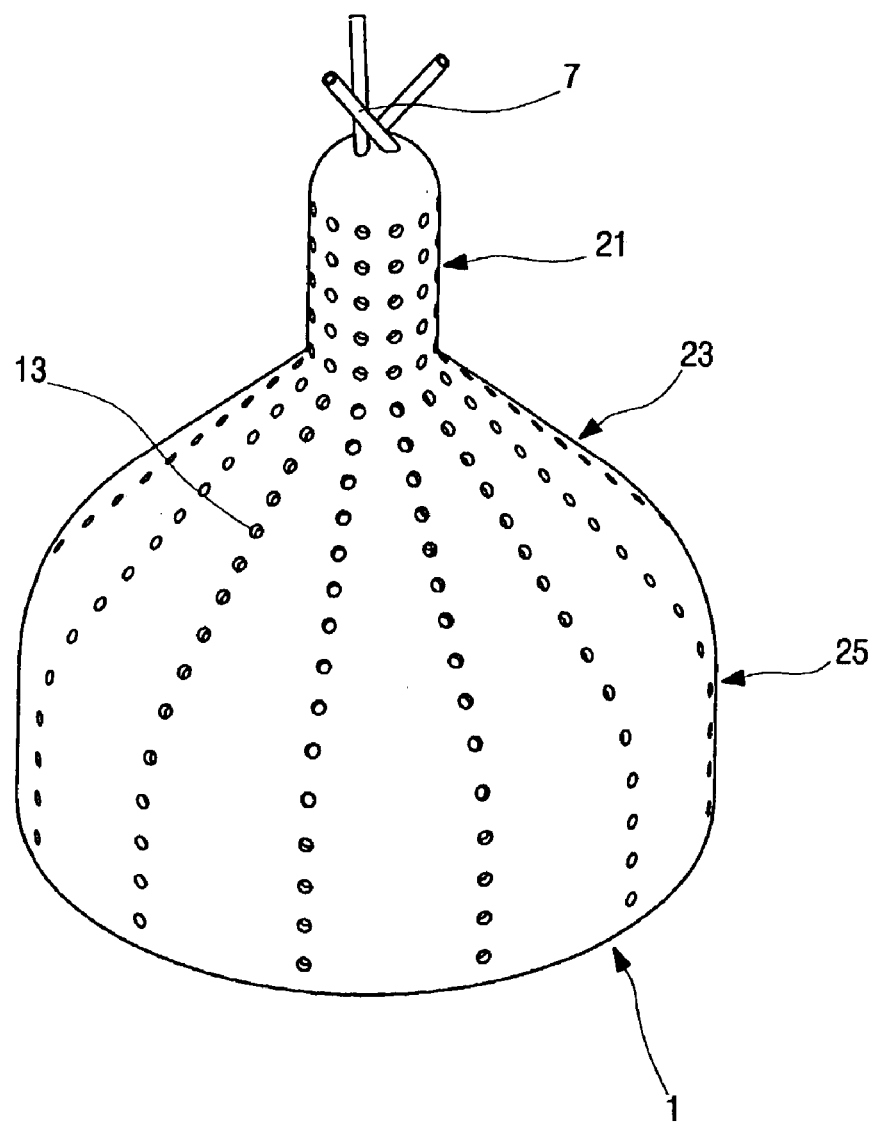
FIG. 8 is a perspective view showing an example of a reactive gas confining means in accordance with the invention.

Hereinafter, various embodiments of the reactive gas confining means 1 in accordance with the invention will be described in detail. The means 1, depicted in FIG. 8, is designed most similar to the shape of the protective curtain formed between the purge gas and the reactive gas, and to envelop the susceptor 5 thoroughly. That is, the means 1 comprising a mixing part 21, a diffusion part 23 and a deposition part 25 in a body flattens the density contour of the reactive gas in parallel to the upper side of the substrates, thus depositing films uniformly in thickness. The means 1 is made of heat and corrosion resistant materials such as stainless steel, ceramic, quartz, or reinforced glass by various methods such as spinning, casting, or molding based on the materials used. The openings 13 are made appropriately by drilling, casting or molding based on the materials used. The size and interval of the openings 13 are designed properly to make a protective curtain, a unique effect of the reactive gas confining means 1. Here, the protective curtain forces the reactive gas fed to the inside of the means 1 not to diffuse outwardly. The size and interval of the openings 13 are suitably regulated to 3 mm in diameter and at intervals of 20 mm, for example, however, not limited since they can be varied according to various factors such as flow rates of the two gasses, density of the reactive gas and overall size of the apparatus used.

Meanwhile, returning to FIG. 7, the showerhead 9 has a plurality of perforations 19 for supporting the protective curtain, of which the intervals can be varied also. For example, the intervals of the perforations 19 in the midst of the showerhead 9 are set wide, whereas, those around the edge of the showerhead 9 are narrow, thus creating a difference in density of the reactive gas within the reaction chamber 3. As a result, the purge gas flow is directed toward the inside of the reactive gas confining means 1. Actually, however, in case that the means 1 is installed in the chamber 3, the same effect can be obtained also by the mere work of the purge gas supply port 27, depicted in FIG. 6, instead of the showerhead 9.

Repeatedly, referring to FIG. 8, the mixing part 21 having a relatively small diameter mixes the main source material and the auxiliary source material rapidly in the narrow space thereof. Besides, the purge gas diffused through the openings 13 formed around the surface of the mixing part 21 helps the source materials to be mixed in the midst of the mixing part 21, while preventing generation of contaminant particles on the inner wall of the mixing part 21.

Figure 9A:
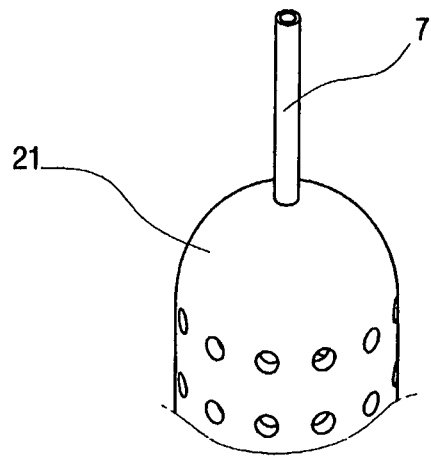
FIGS. 9A, 9B and 9C shows various types of reactive gas supply port formed on the top of the reactive gas confining means in accordance with the invention.
Figure 9B:
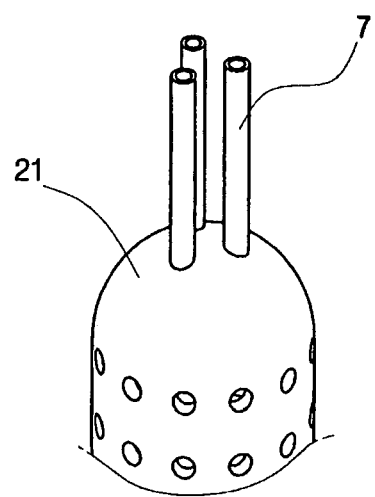
Figure 9C:
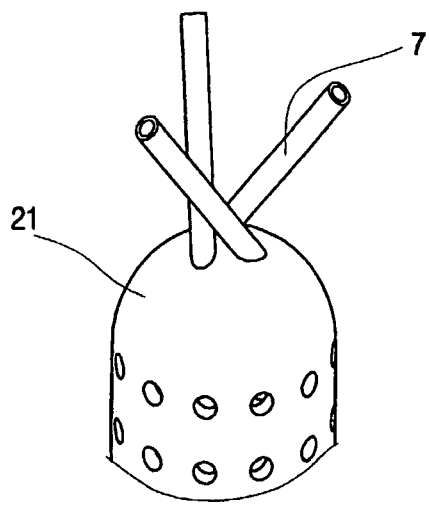
Figure 10:
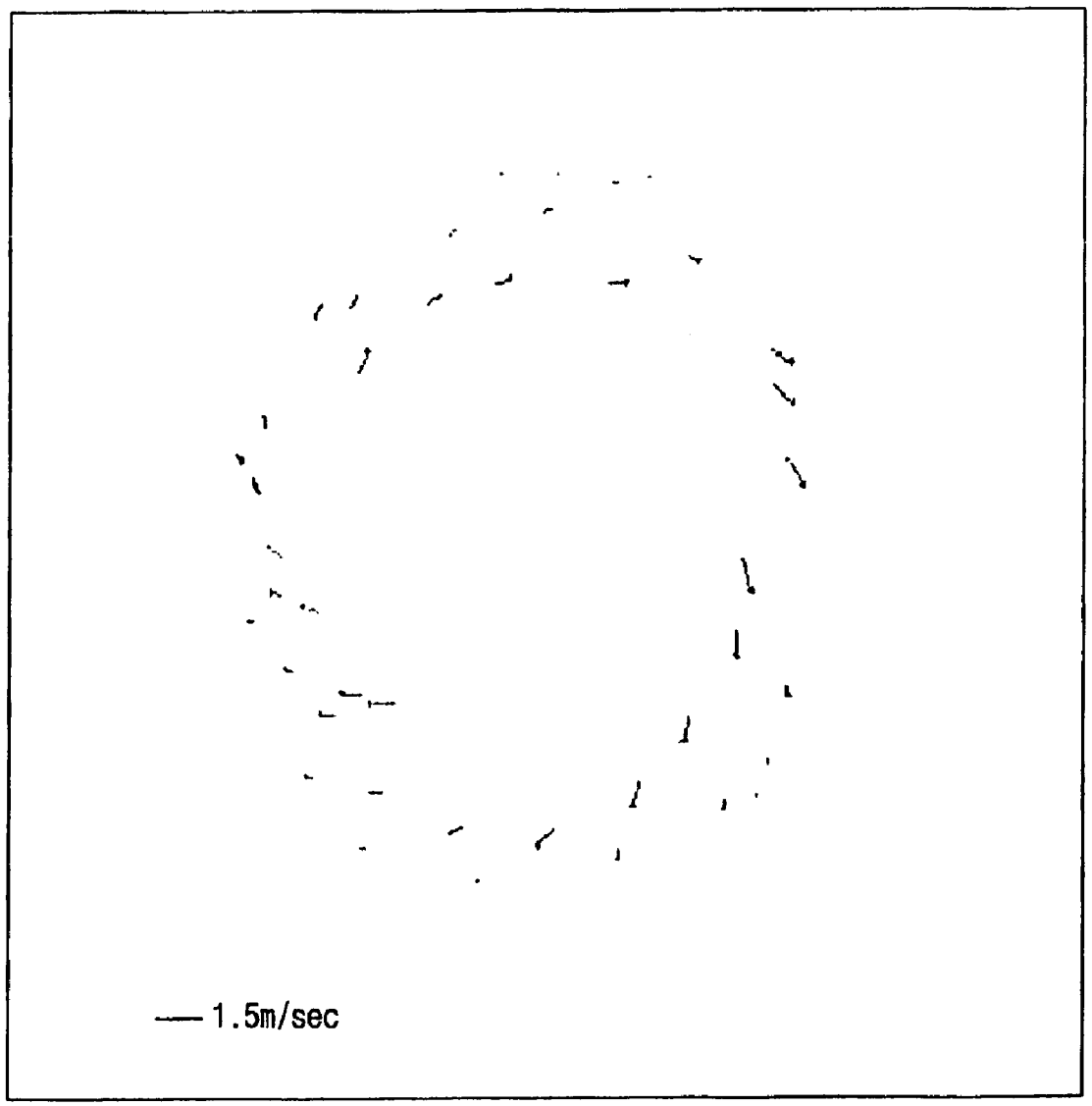
FIG. 10 shows a swirl phenomenon of the reactive gas injected through the inclined reactive gas supply ports depicted in FIG. 8C in accordance with another embodiment of the invention.

The reactive gas supply ports 7 established on the top of the mixing part 21 can be configured to have various types. For example, a single perpendicular conduit as a reactive gas supply port 7, shown in FIG. 9A, can be adopted when the main and auxiliary source materials mixed in advance or a pure main source material of vapor phase without carrier gas is injected. Besides, as shown in FIGS. 9B and 9C, a plurality of perpendicular or inclined conduits, as another types of the reactive gas supply port 7, can be used when various kinds of the source material, mixed or unmixed, are injected directly. Here, the source material injected through the inclined ports 7 of FIG. 9C induces a swirl phenomenon (an effect of cyclone), which lengthens traveling path of the source materials supplied, thus mixing the source materials satisfactorily. Accordingly, when it is required to establish a long path through which the source materials travel, or when the axial length of the reaction chamber 3 is short, it is desired to feed the reactive gas into the chamber 3 in the inclined direction, as shown in FIG. 9C. The reactive gas supply port 7 having an internal diameter less than 10 mm is formed with a tubular tube made of stainless steel, ceramic, Teflon, etc. The reactive gas supply port 7 is connected to bubbler, vaporizer, etc., not depicted, to supply the reactive gas to the inside of the means 1.

The diffusion part 23, of which diameter becomes wider downward, diffuses high concentrated reactive gas mixed in the mixing part 21 in an inclined direction, thus flattening the density contour. Afterwards, the high density of the reactive gas gets decreased while it is diffused in the inclined direction through the diffusion part 23 that grows voluminous downward. Here, the diverging angle and the height of the diffusion part 23 are closely related with the flow rate of the reactive gas. For example, if the diffusion process occurs rapidly, the diverging angle of the diffusion part 23 may get increased and the height be lowered.

The longitudinal deposition part 25 is a region where the flattened density contour of the reactive gas meets parallel to an upper side 15 of the susceptor 5. The upper side 15 of the susceptor 5, on which film is formed substantially, should be located to a region where the density of the reactive gas is set adequate and the density contour is sufficiently flattened. Accordingly, the longitudinal deposition part 25 is designed to have an ample height enough to surround the upper side 15 of the susceptor 5. Besides, to discharge exhaust gas smoothly, it is also desired to increase the height of the deposition part 25 as much as possible. The plural openings 13 perforated on the surface of the means 1 are configured to induce a portion of the purge gas distributed to the outside of the reactive gas confining means 1 to diffuse in a normal direction to the surface of the means 1. As a result, the reactive gas is impeded to escape outside from the means 1 by means of the protective curtain of purge gas. Besides, the highly concentrated reactive gas apt to diffuse outward also prevents the purge gas from permeating to the inside of the means 1 over a predetermined depth. Accordingly, there is formed a protective curtain in the inside of the reaction chamber 3 due to the mutual diffusion-suppressing action between the two gasses. As a result, it is possible to confine the reactive gas to the inside of the means 1, without touching the inner wall of the means 1, by regulating the amounts and flow rates of the two gasses properly. Consequently, in the CVD apparatus in accordance with the present invention, there are not generated contaminant particles on the inner wall of the chamber 3 and the inner and outer walls of the means 1 as well.

Meanwhile, the reactive gas confining means 1 according to the invention is not limited to the form depicted in FIGS. 7 and 8, but can be designed to various forms based on the characteristics of the reactive gas and the conditions of the chamber 3. For example, the means 1 shown in FIG. 11 has no mixing part 21, and the diverging angle of the diffusion part 23 thereof is increased sharply. This type of the means 1 can be adopted when the diffusion rate of the reactive gas is very high, and advantageously employed when using a large size substrate. The other components of the means 1 of FIG. 11 have the same functions with that of FIG. 8. The means 1 depicted in FIG. 12 includes no diffusion part 23 as well as the mixing part 21, but only the deposition part 25 having a predetermined height. In this case, the protective curtain can be formed through the openings 13 in the same manner described above, however, the reactive gas fed to the inside of the means 1 doesn't diffuse readily, thus deteriorating the horizontal uniformity of the reactive gas density.

Figure 13:
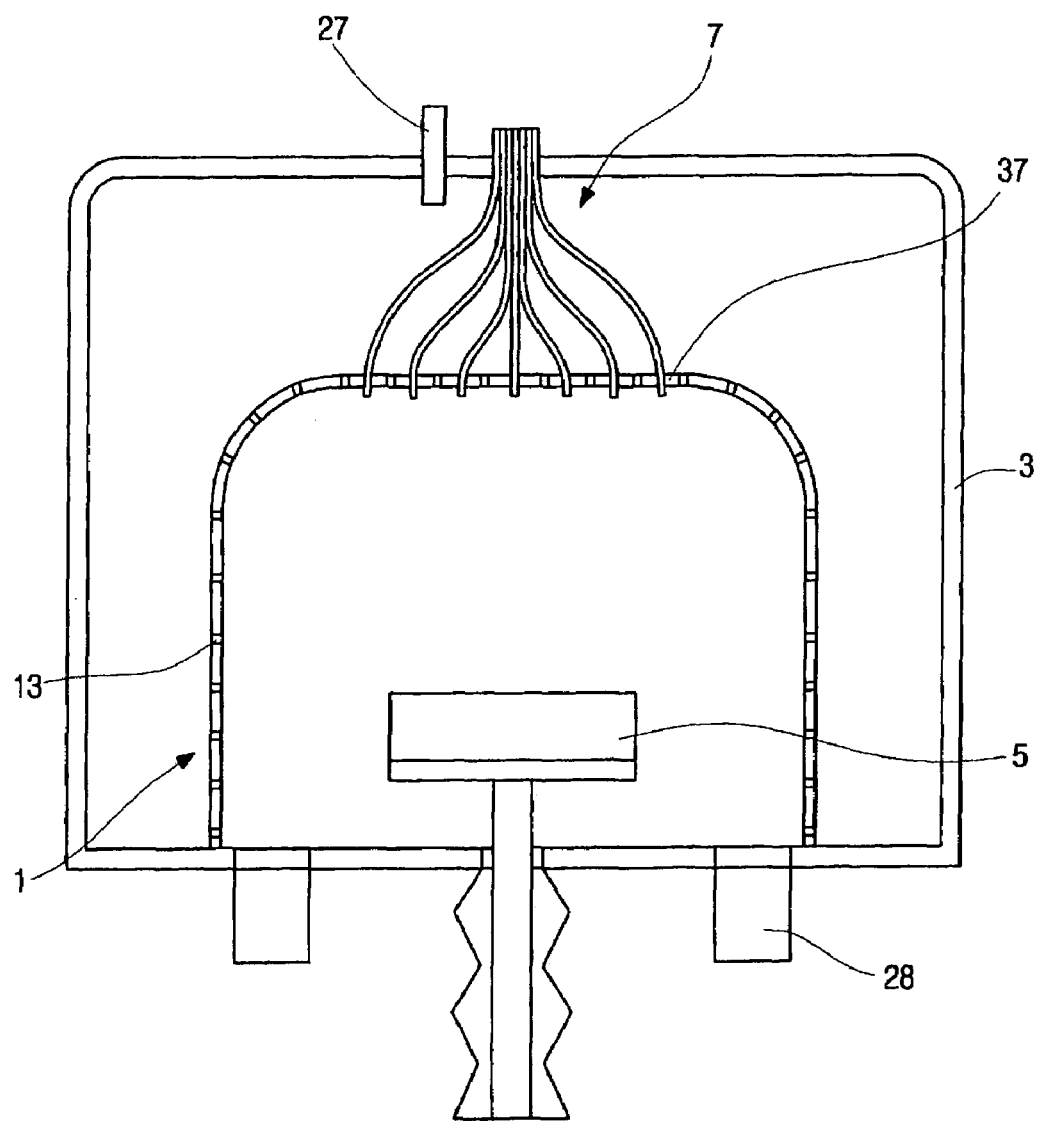
FIGS. 13, 14, 15 and 16 are schematic sectional views showing various types 15 of the reaction chamber where the reactive gas confining means is provided in accordance with the present invention.
Figure 14:
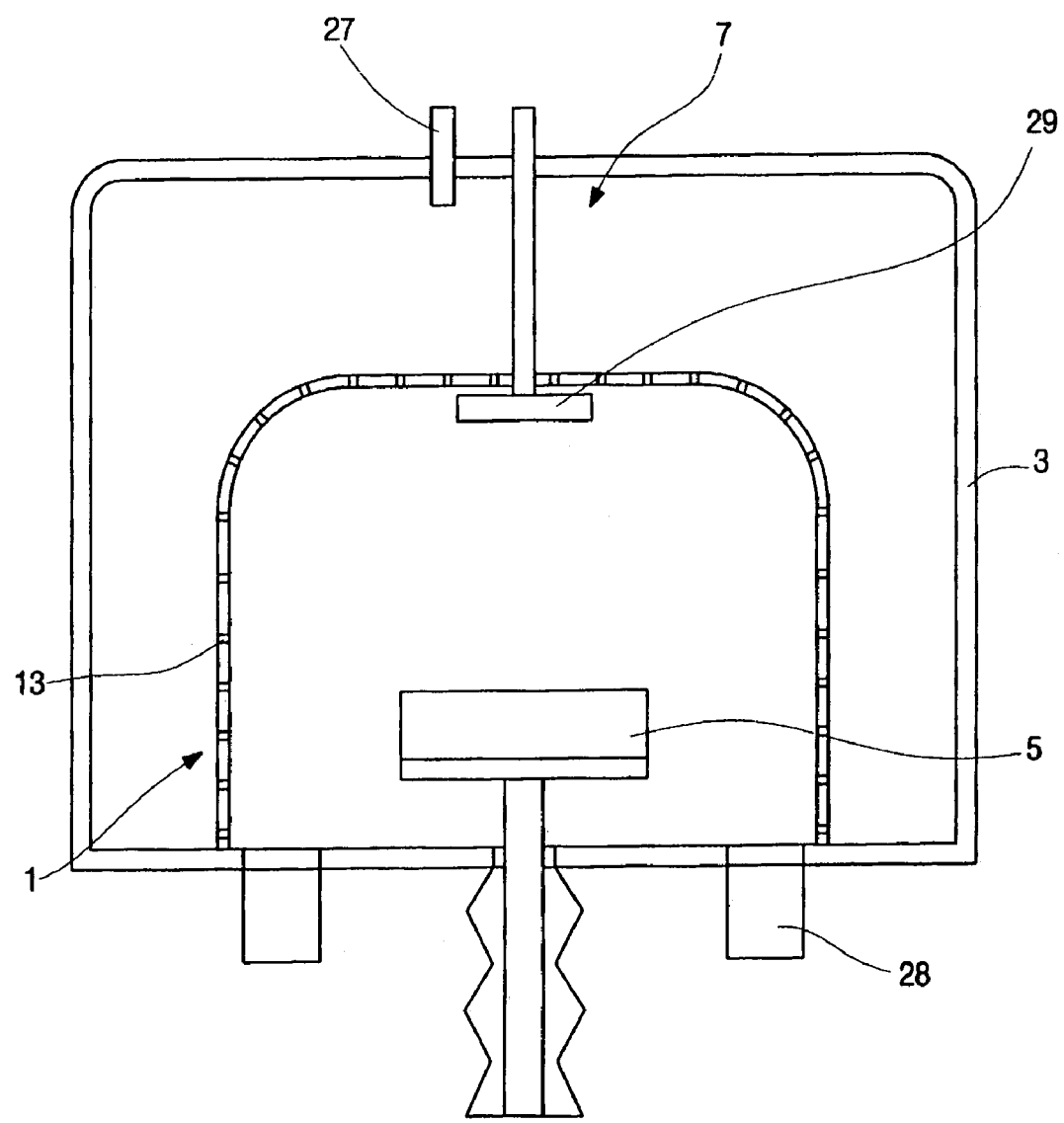

Accordingly, it is desired to establish the reactive gas supply port(s) 7 as shown in FIGS. 13 and 14. The reactive gas supply ports 7 in FIG. 13 penetrate the means 1 through a plurality of reactive gas supply paths 37 provided on the top of the means 1 at regular intervals to supply the reactive gas to the inside of the means 1 uniformly. Meanwhile, the reactive gas supply port 7 in FIG. 14 is connected with a showerhead 29 in the means 1 to spread the reactive gas wide and uniformly.

Figure 15:
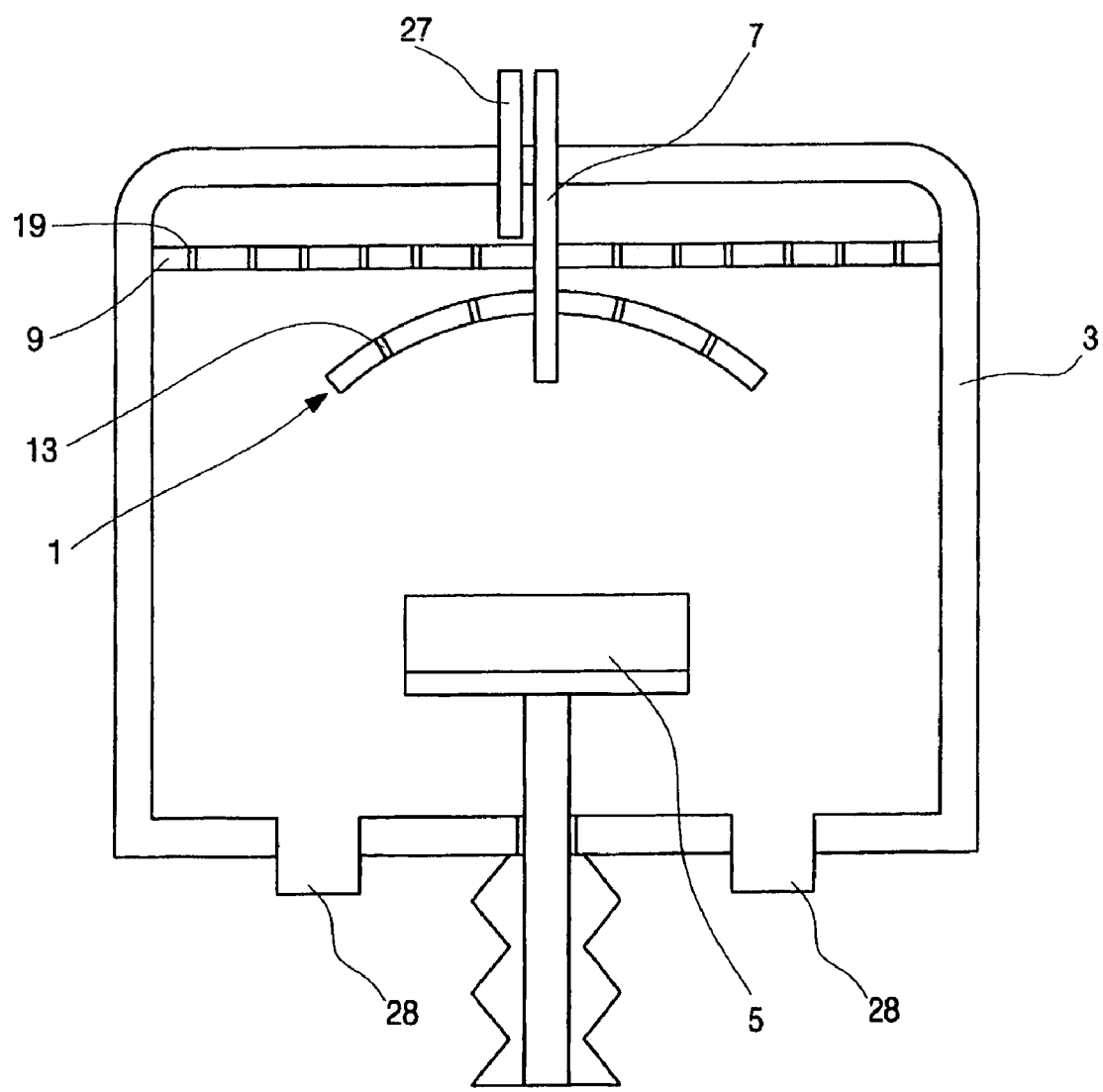

With reference to FIG. 15, there is shown another type of the reactive gas confining means 1 in accordance with the present invention having a dome-like shape of low height, which excludes the mixing part, diffusion part and deposition part. That is, when the reactive gas and purge gas are fed separately into the midst of the reaction chamber 3 where the purge gas is filled up, there is formed a protective curtain over the susceptor 5. Here, the dome-like reactive gas confining means 1 prevents the protective curtain from being broken. Besides, if the showerhead 9 is further provided over the means 1, it is much helpful to create a more stable protective curtain.

Figure 16:
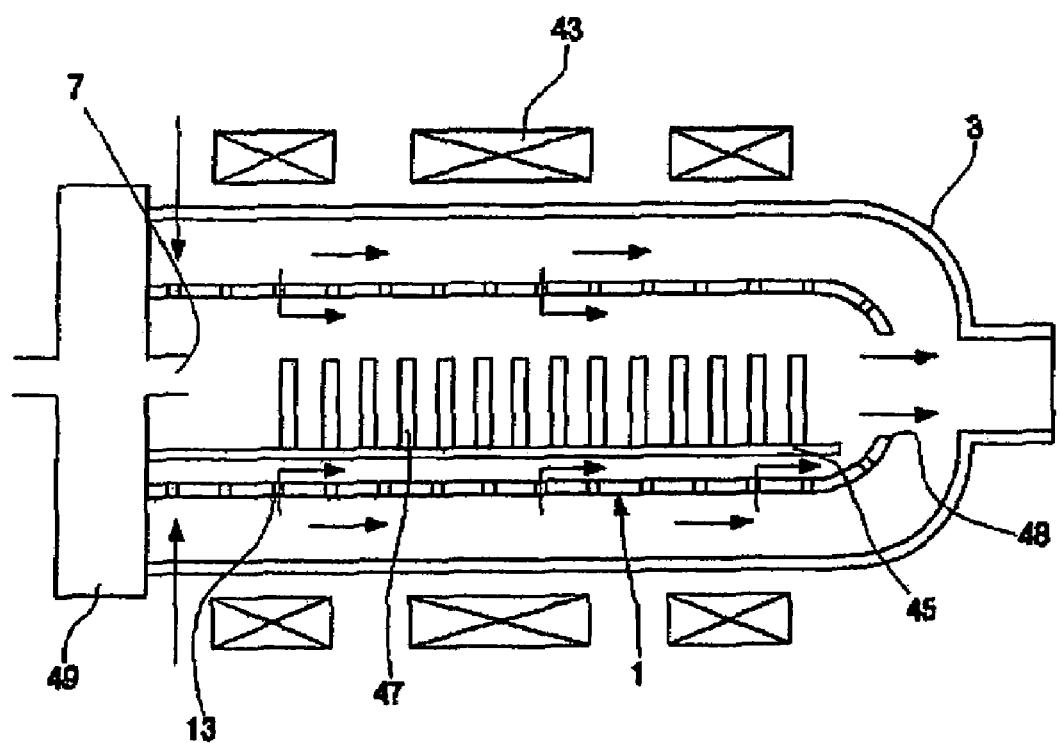

Next, referring to FIG. 16, the reactive gas confining means 1 in accordance with the present invention is applied to a low-pressure chemical vapor deposition (LPCVD), where a plurality of wafers 47 stands erect on a boat 45 established in a horizontal direction. Here, the cylindrical means 1 provided in the same direction with the boat 45 has a plurality of openings 13 perforated on the surface thereof, a reaction gas supply port 7 on one end thereof extended to a side wall of a reaction chamber 3 mainly comprising a mixing chamber 49, and an exhaust port 48 for discharging byproducts on the other end thereof. When the purge gas is fed into the outside of the means 1 and the reactive gas is supplied to the inside of the means 1, the purge gas is introduced to the inside of the means 1 through the openings, thus creating the protective curtain between the purge gas and reactive gas in the means 1. Accordingly, the density of the reactive gas concentrated around the boat 45 on which the plural wafers 47 are placed is increased. However, there exists no reactive gas on the inner wall the reaction chamber 3, and the inner and outer surfaces of the means 1 as well, thus preventing generation of contaminant particles.

That is, according to the CVD apparatus using the reactive gas confining means 1 and the protective curtain of purge gas of the present invention, the density of the reactive gas concentrated in the midst of the reaction chamber 3 is increased more than several or several tens of times compared with that in the other region by supplying the purge gas into the outside of the means 1 while feeding the reactive gas to the inside of the means 1, separately.

In addition to this, neither the local re-circulation caused by the inconsistency of chamber geometry nor the natural convection caused by temperature difference between the relatively cold wall of the chamber 3 and the hot susceptor 5 seems to occur easily inside the means 1, since the purge gas flow has a direction normal to the surface of the means 1 and exerts a stabilizing effect as followings. The purge gas which was directed from the outside to the inside of the means 1 confines the reactive gas into the means 1 and makes laminar flowing state of the reactive gas in the vicinity of the substrate. This effect can be regulated by the purge gas flow rate that would be, for example, several times as large as the reactive gas flow rate.

Consequently, the present invention is disclosed to increase the film growth rate and the uniformity of the film thickness remarkably, and minimize the generation of the contaminant particles by designing the geometry of the reaction chamber 3 optimally including the type of reactive gas confining means 1, the location of susceptor, etc., and by controlling the amount of purge gas flow, and the mixing, diffusion and exhaust of source materials properly.

Hereinafter, various embodiments of the method and apparatus for CVD capable of preventing contamination and enhancing film growth rate according to the present invention will be described in following examples.

EXAMPLE 1

Configuration of CVD Apparatus

In a preferred embodiment in accordance with the present invention, as shown in FIG. 7, the reactive gas confining means 1 having a diameter of 300 mm and a height of 445 mm was provided to surround the susceptor 5, having a diameter of 240 mm and a height of 80 mm, positioned in the midst of the reaction chamber 3. The means 1 employed has a funnel-like shape through which the purge gas is diffused to the inside of the means 1. The reactive gas supply ports 7 were equipped on the top of the means 1 and the purge gas supply port 9 provided over the means 1.

EXAMPLE 2

TiO$_2$ Film Deposition

TiO$_2$ film deposition was made using the CVD apparatus described in Example 1. Following equation denotes TiO$_2$ film deposition by TIP pyrolysis.

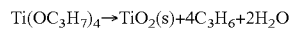

Titanium iso-propoxide (TIP, Ti(OC3H7)4) was employed as a precursor for TiO$_2$ film deposition. The vapor pressure of TIP was 2 Torr at 70° C. The heating temperature of TIP was 85° C., and the reaction chamber pressure was 133 Pa. Pure TIP gas was supplied to the inside of the means 1 at a flow rate of $1\times10^{-6}$ kg/sec without the aid of carrier gas, whereas Argon as purge gas was injected into the outside of the means 1 at a flow rate of $10\times10^{-6}$ kg/sec. At appropriately low heating temperatures, i.e., at the range from 70° C. to 100° C., TIP can be easily vaporized but hardly decomposed in the TIP container. Pure vapor of TIP can be delivered without the aid of carrier gas into the chamber 3 where the chamber pressure is much lower than the TIP vapor pressure. Here, there is an advantage that facilitates quantitative analysis of the metal organic compounds used in the MOCVD process. To simulate the deposition behavior, a computational fluid dynamics program, Fluent, was utilized. Herein, Lennard Jones parameter was introduced for convenience since the kinetic theory can easily calculate the theoretical physical properties of TIP such as diffusion coefficient, thermal conductivity, specific heat etc. L-J characteristic length (Angstrom) and energy parameter (K), which are the values of Lennard Jones parameters of TIP and other gases, can be referenced elsewhere.

EXAMPLE 3

Figure 17:
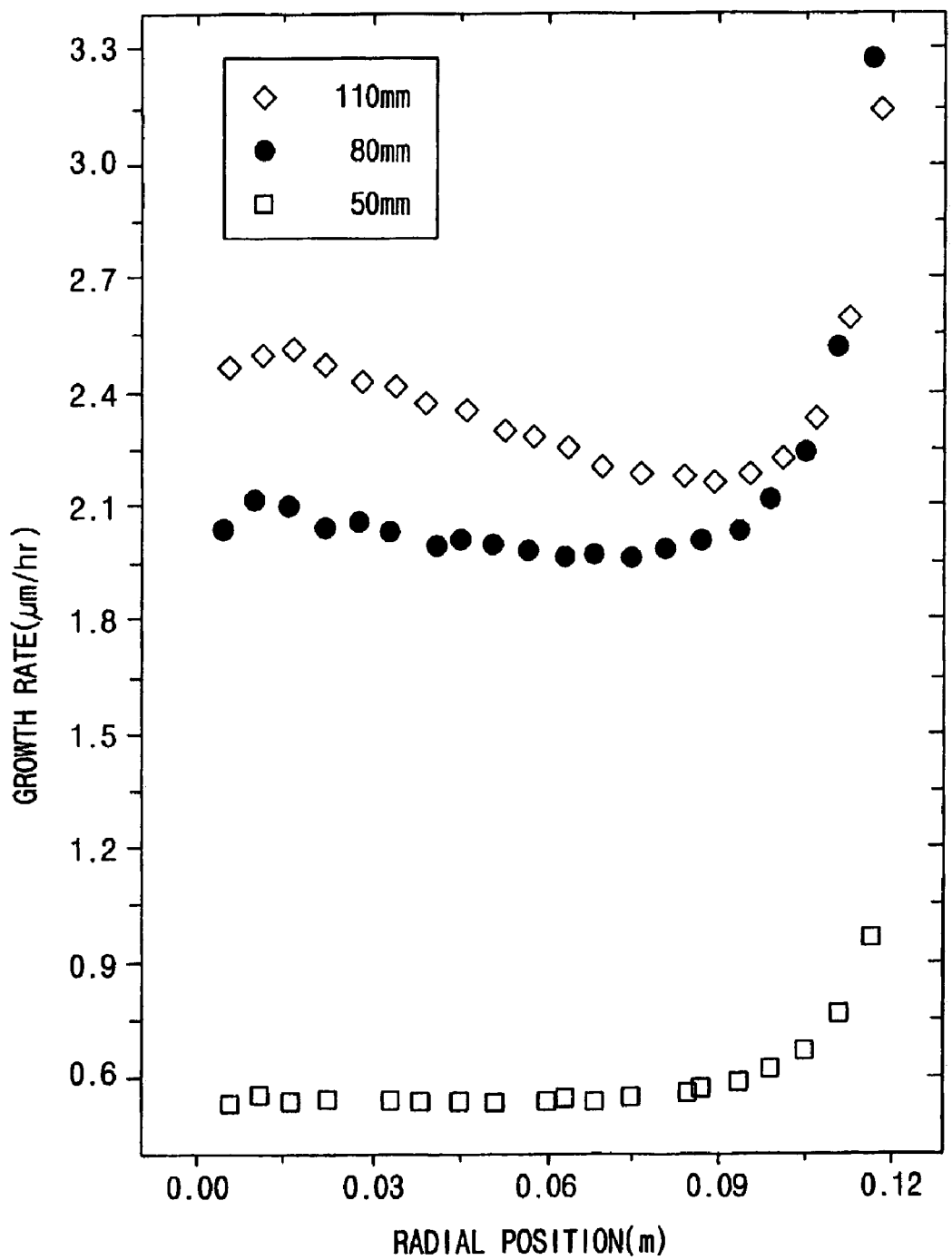
FIG. 17 is a graph showing variations of $TiO_2$ growth rate based on the heights of the susceptor in the reaction chamber in accordance with the invention.

As shown in FIG. 17, TiO$_2$ film deposition was made at various heights of the susceptor from the bottom of the means 1 with the CVD apparatus and conditions described in Examples 1 and 2, respectively, while keeping the uniformity of the deposition within ±5% in the range less than 100 mm in radial position. It was understood that the reason why the film growth rate beyond the radial position 100 mm, i.e., the edge portion of the upper surface of the susceptor, is increased steeply is because the velocity vector is abruptly changed in this vicinity.

EXAMPLE 4

Figure 18:
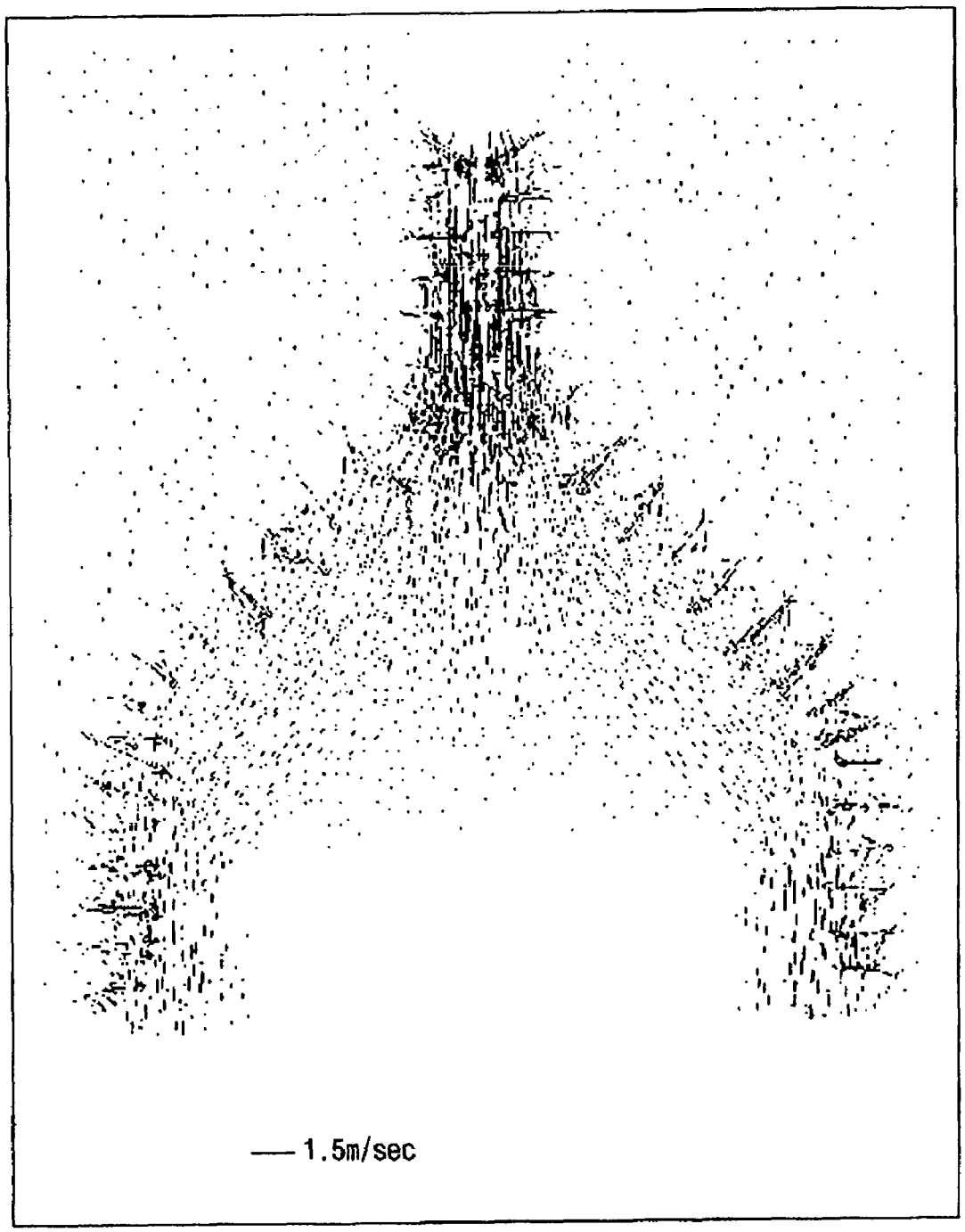
FIG. 18 shows a drift velocity vector of a mixed gas composed of the reactive gas and the purge gas in the CVD apparatus in accordance with the invention.
Figure 19:
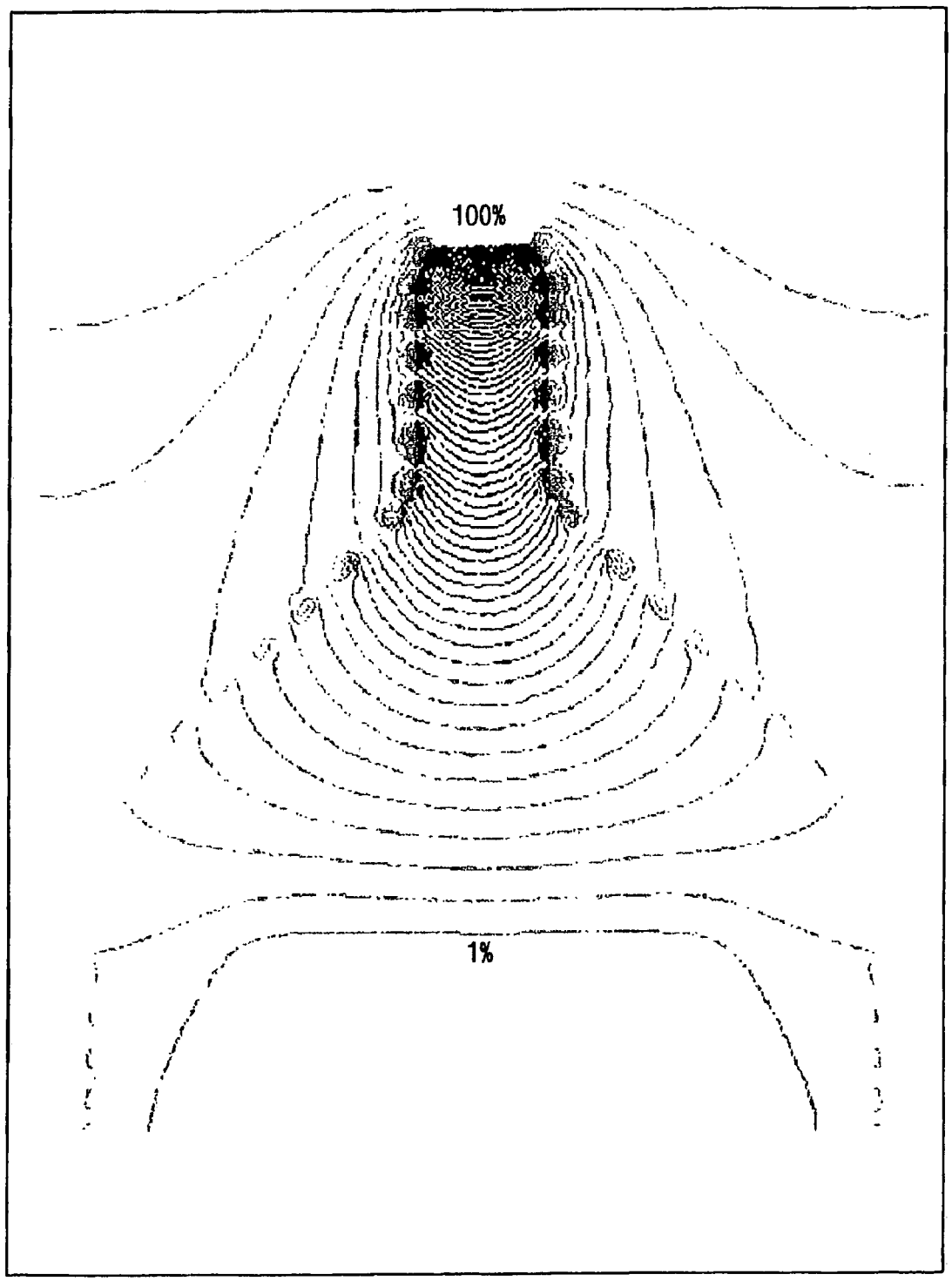
FIG. 19 shows how the density of the reactive gas is distributed in the CVD apparatus in accordance with the invention.

FIG. 18 depicts the drift velocity vector of the mixed gas composed of the reactive gas and purge gas. The maximum velocity was about 1.5 m/sec. It can be seen that there was formed the protective curtain that confines the highly concentrated reactive gas in the midst of the reaction chamber 3 from the outside to inside of the means 1. Besides, FIG. 19 illustrates how the density (mass fraction) of the TIP is distributed in the CVD apparatus in accordance with the invention. The maximum and minimum concentrations are 100% and 0%, respectively, and the contour is drawn at the interval of 1%. It can be noted that the purge gas fed to the inside of the means 1 doesn't so much decrease the density of the TIP injected from the reactive gas supply ports 7 at the mixing part 21. Moreover, due to the effect of the protective curtain having a normal direction from the outside to the inside of the means 1, the density of the TIP adjacent to the inner wall of the chamber 3 is detected extremely low, such that there were not generated unwanted contaminant particles on the inner wall of the chamber 3. In addition to this, the net velocity of the TIP, i.e., the vector sum of the drift velocity of the mixed gas and the TIP diffusion velocity, can be selected to have a normal direction from the outside to the inside of the means 1. That is, since the range of the purge gas flow rate to be selected is very wide, for example, several to several tens times as large as the TIP flow rate, while keeping the uniformity of the TiO$_2$ growth within ±5% in practice, there is no possibility that the net velocity of the TIP exists eventually in the direction from the inside to the outside of the means 1.

EXAMPLE 5

Figure 20:
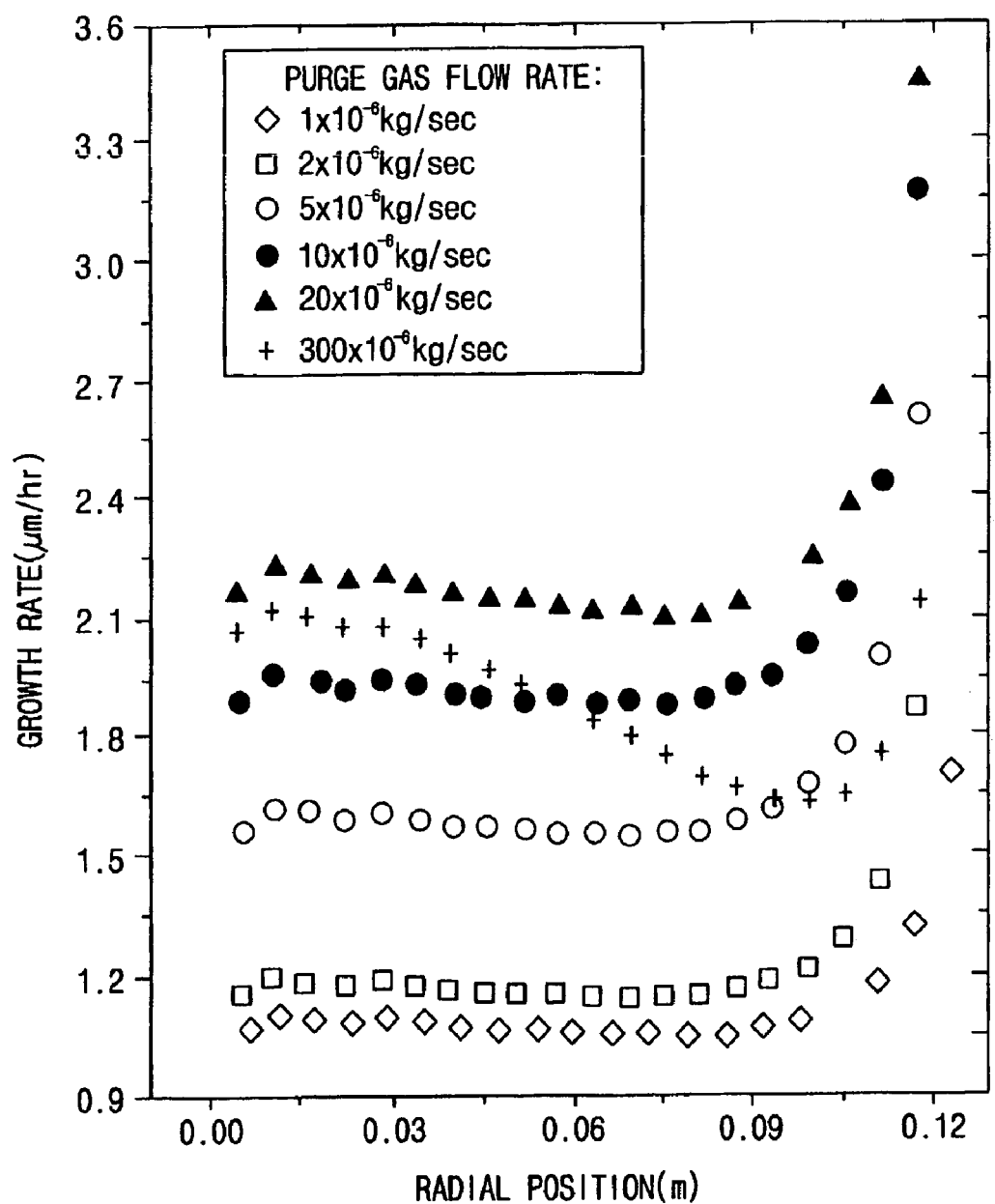
FIG. 20 is a graph illustrating variations of $TiO_2$ growth rate based on the purge gas flow rates in accordance with the invention.

FIG. 20 shows variations of $TiO_2$ growth rate based on the purge gas flow rates, obtained when supplying the pure TIP vapor not diluted to the inside of the means 1 of the CVD apparatus described in Example 1. It was noted that the protective curtain, which confines the TIP flow within the means 1, becomes thicker accordingly as the purge gas flow is increased. That is, at the purge gas flow rate of $20 \times 10^{-6}$ kg/sec, the $TiO_2$ growth rate was the highest and relatively uniform in the radial direction of the susceptor. However, if the purge gas flow rate is more than $300 \times 10^{-6}$ kg/sec, the TIP vapor may be over-concentrated in the midst of the chamber 3. As a result, the $TiO_2$ growth rate in the midst of the 200 mm Si wafer on the substrate, for example, was much higher than that in the edge portion of the wafer.

EXAMPLE 6

Figure 21:
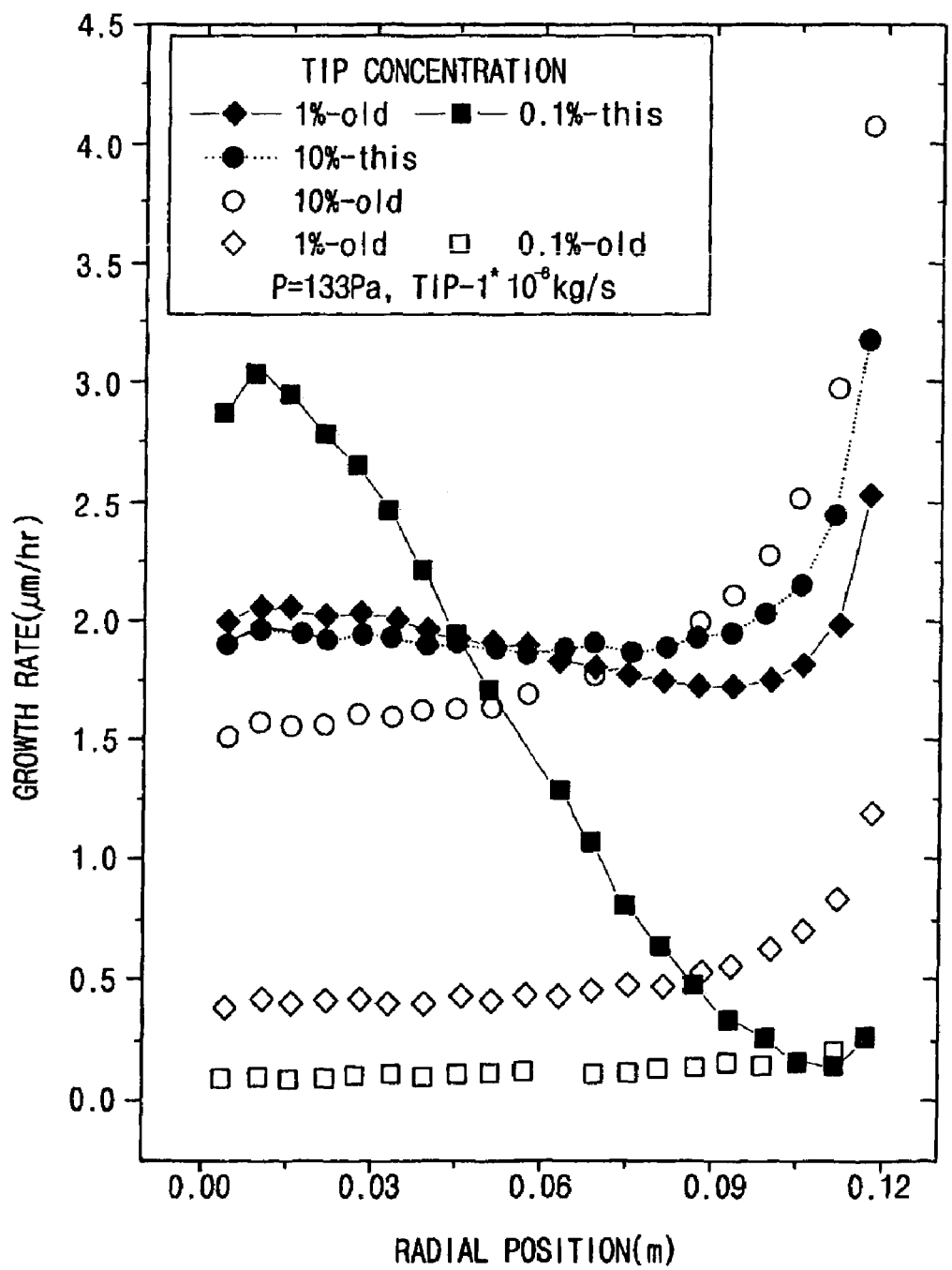
FIG. 21 is a graph depicting variations of $TiO_2$ growth rate obtained by using a conventional showerhead type CVD apparatus and the CVD apparatus of the present invention.

Next, FIG. 21 depicts variations of $TiO_2$ growth rate obtained by using a conventional showerhead type CVD apparatus and the CVD apparatus described in Example 1. Here, input mass fraction of TIP is defined as the ratio of TIP input mass flow rate to total input mass flow rate. It was found that at all input mass fractions of TIP, the present invention (■●◆) provides much higher $TiO_2$ growth rate than that of conventional method (□○◇). For example, if the input mass fraction of TIP is 10%, the $TiO_2$ growth rate of the present invention (●) is more than 30% higher than that of the conventional method (○). If the input mass fraction of TIP is 1%, the $TiO_2$ growth rate of the present invention (◆) is more than 300% higher than that of the conventional method (◇).

EXAMPLE 7

Figure 22:
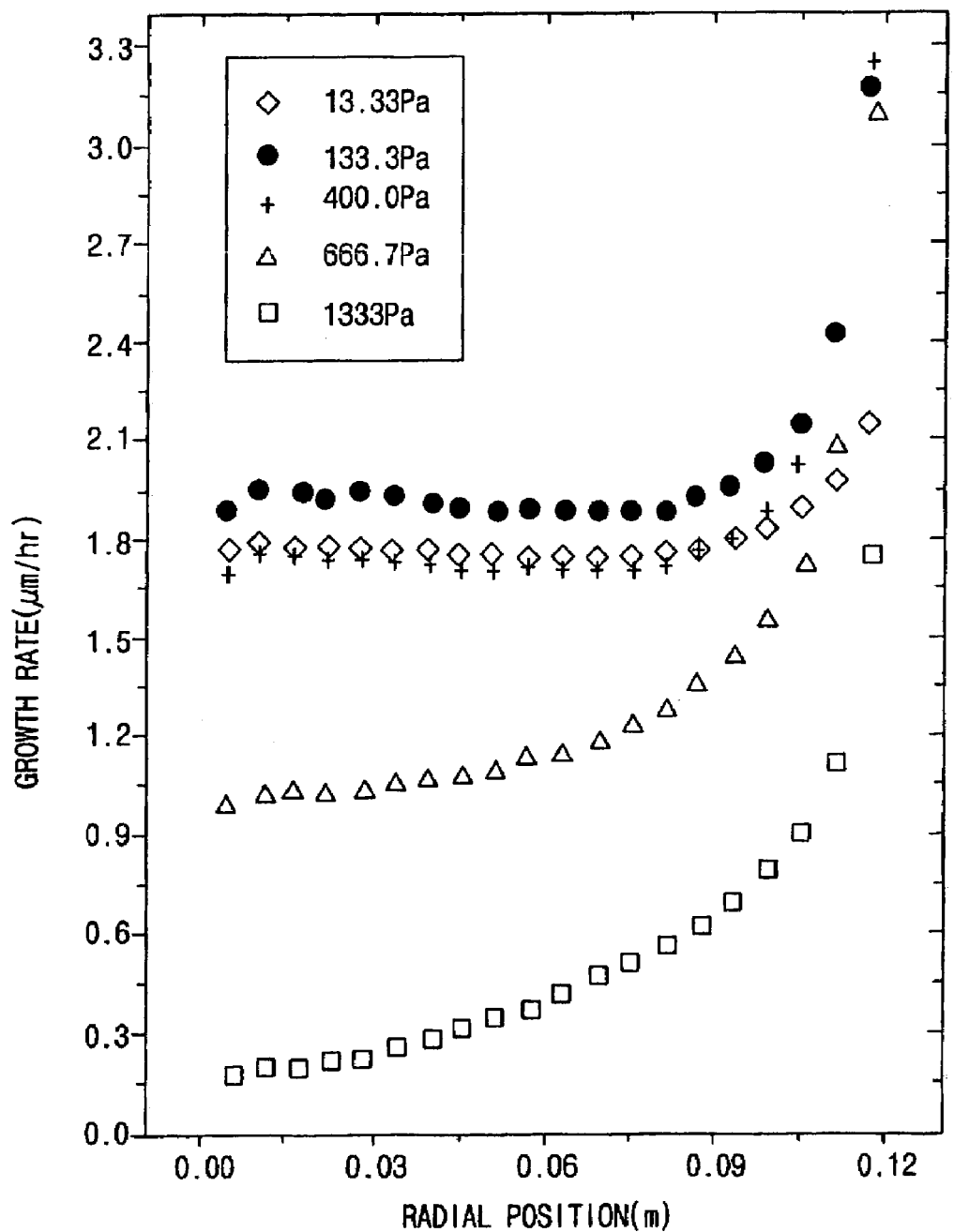
FIGS. 22 and 23 show variations of $TiO_2$ growth rate based on the vacuum pressures in the reaction chamber in accordance with the invention.
Figure 23:
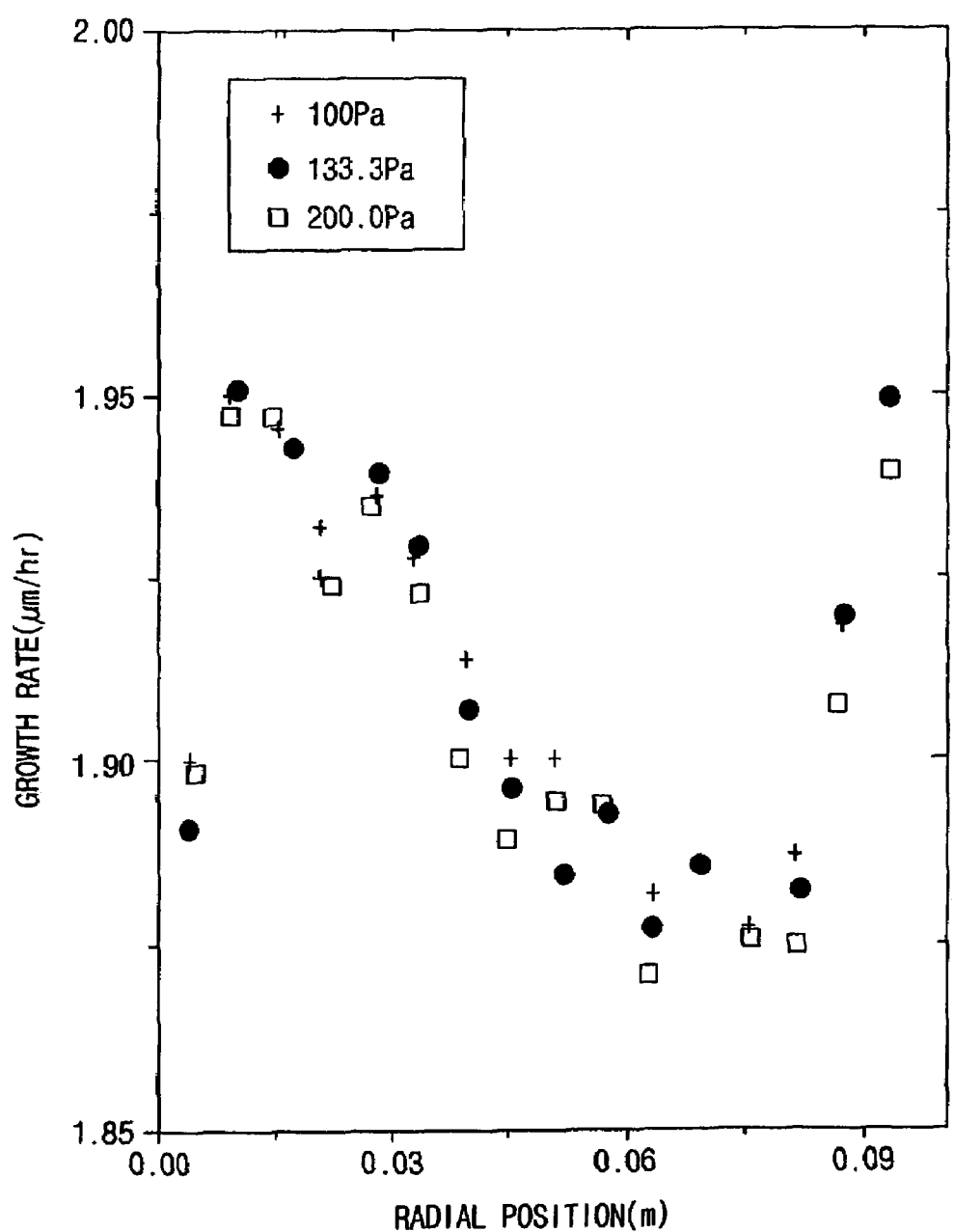

As depicted in FIGS. 22 and 23, showing variations of $TiO_2$ growth rate based on vacuum pressures in the chamber 3, it was found that the $TiO_2$ growth rate gradually increases accordingly as the chamber pressure rises, and reaches a maximum value at a pressure of 133 Pa, then slowly decreases at pressures more than 133 Pa. Besides, it was noted that the $TiO_2$ film growth rate is not sensitively influenced by the chamber pressure within a wide range around 133 Pa, which allows plenty of scope for the change of vacuum pressure in mass production.

EXAMPLE 8

Figure 24:
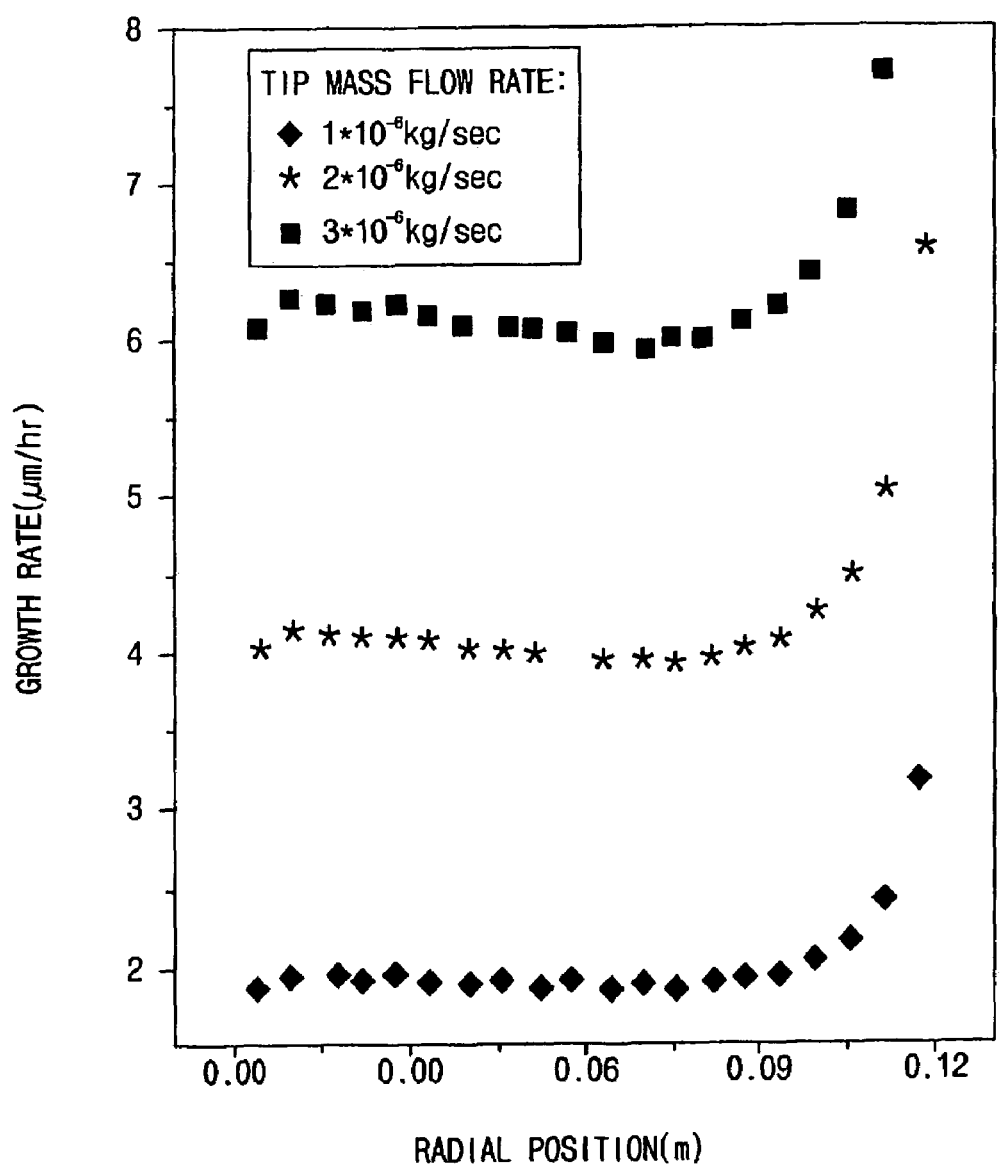
FIG. 24 illustrates variations of $TiO_2$ growth rate based on the TIP flow rates in accordance with the invention.

As shown in FIG. 24, illustrating variations of $TiO_2$ growth rate based on the TIP flow rates, it was noted that the growth rate of $TiO_2$ film increases remarkably according as the flow rate of TIP rises when using the means 1 of the invention. Especially, when delivering the pure TIP vapor without carrier gas to the inside of the means 1, $TiO_2$ film growth rate increased in proportion as the input flow rate of TIP rose. That is, since it is very easy to increase the input flow rate of TIP when supplying the pure TIP vapor without carrier gas, it is desired to employ the pure TIP vapor without carrier gas when it is necessary to ensure high growth rates.

EXAMPLE 9

Figure 25:
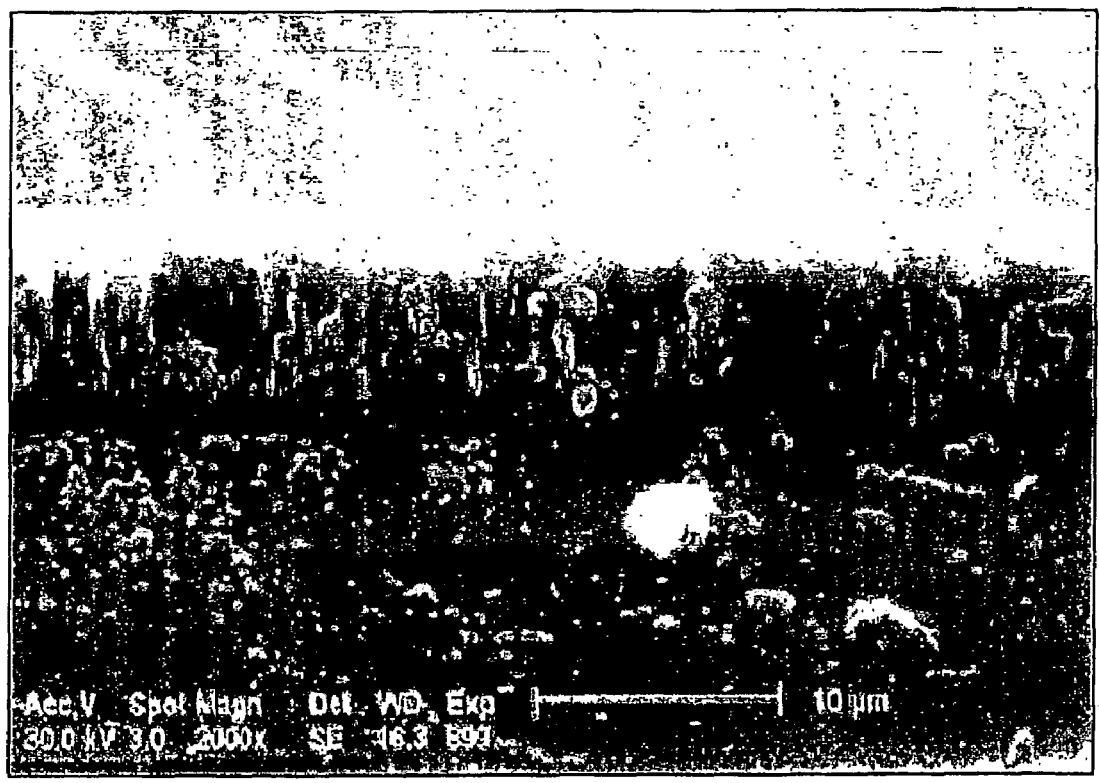
FIG. 25 is a cross-sectional electron microscope view of a $TiO_2$ film formed on a bare silicon wafer in accordance with the invention.

FIG. 25 is a cross-sectional electron microscope view of a $TiO_2$ film formed on a bare silicon wafer using the CVD apparatus accordance with the invention. The $TiO_2$ film was formed 8 μm in thickness at a growth rate of 20 μm/h in the chamber 3 at a pressure of 133 Pa. It can be understood that the growth rate obtained in this example is remarkably high, which shows a superiority of the present invention for depositing thick films.

Figure 26:
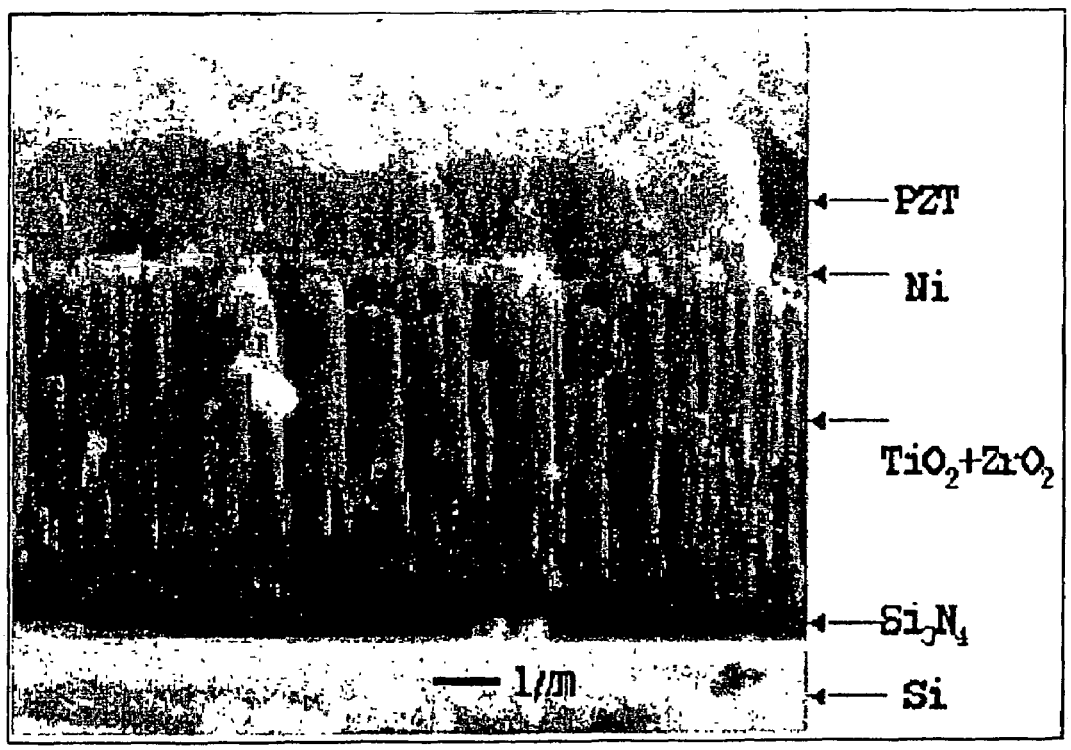
FIG. 26 is a cross-sectional electron microscope view of a PZT/Ni/$TiO_2$+$ZrO_2$ film on a $Si_3N_4$ layer in accordance with the invention.

Meanwhile, FIG. 26 is a cross-sectional electron microscope view of a PZT/Ni/ $TiO_2+ZrO_2$ film on a $Si_3N_4$ layer using the CVD apparatus in accordance with the invention. At first, $TiO_2+ZrO_2$ layer was deposited on a nitride silicon wafer, where TIP and Zirconium tert-butoxide were precursors for $TiO_2$ and $ZrO_2$ components, respectively. Then, Ni electrode was formed on the $TiO_2+ZrO_2$ layer by RF sputtering. Finally PZT layer was deposited using the present invention. Here, tetraethyl-lead ($Pb(C_2H_5)_4$) was adopted as a precursor for a lead component together with TIP and Zirconium tert-butoxide described above, and oxygen was used to make lead oxide compounds which also constitute PZT. As shown in FIG. 26, the film thickness of $TiO_2+ZrO_2$ grown on the $Si_3N_4$ layer is about 5 μm and the film thickness of PZT film formed on a Ni electrode is about 3 μm.

EXAMPLE 10

Figure 27:
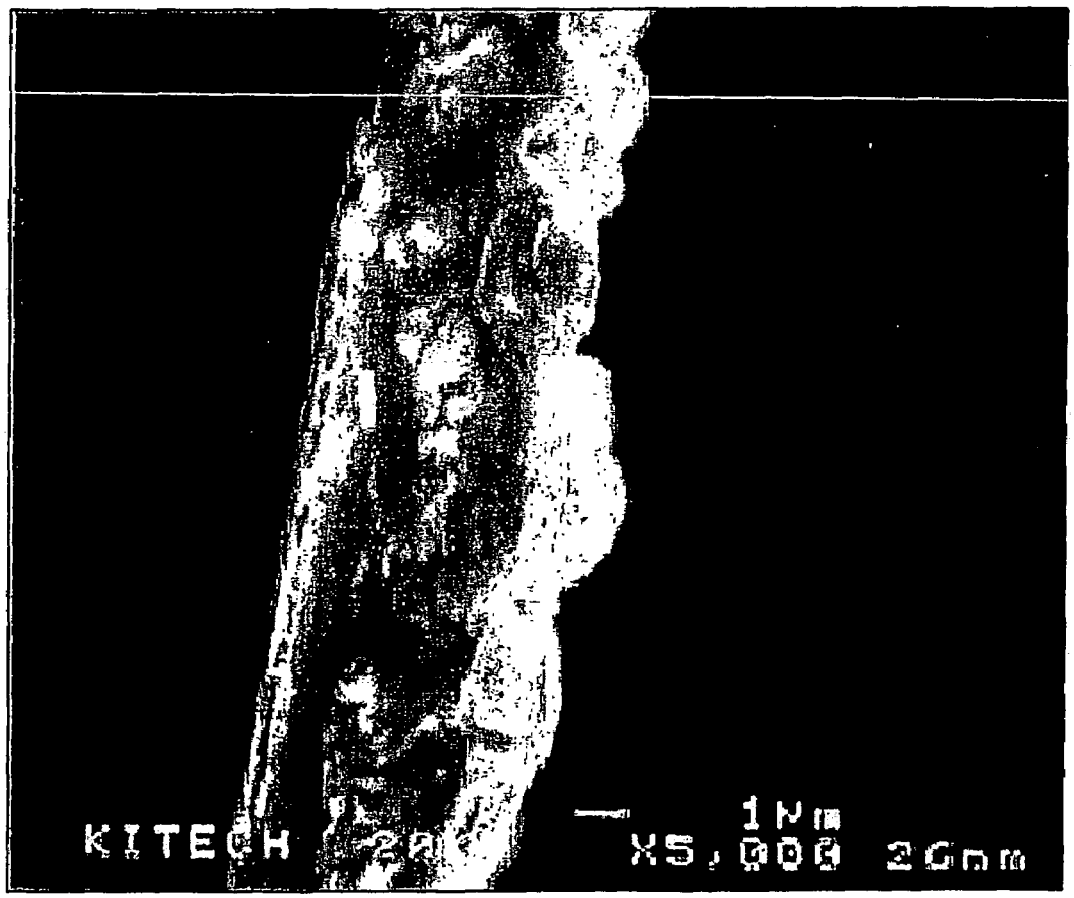
FIG. 27 is a cross-sectional electron microscope view of a PZT film grown on a bare silicon wafer in accordance with the invention.

Next, FIG. 27 is a cross-sectional electron microscope view of a PZT film grown on a bare silicon wafer using the CVD apparatus in accordance with the invention. The PZT film was formed 6 μm in thickness at a growth rate of 6 μm in the chamber 3 at a pressure of 200 Pa. It can be recognized that the morphology of the deposited PZT film is not so planar, but the thickness of the PZT film obtained according to the present invention is much enhanced compared with the conventional methods described earlier, and may belong to the thickest one among the PZT films prepared by the metal-organic chemical vapor deposition (MOCVD).

EXAMPLE 11

Figure 11:
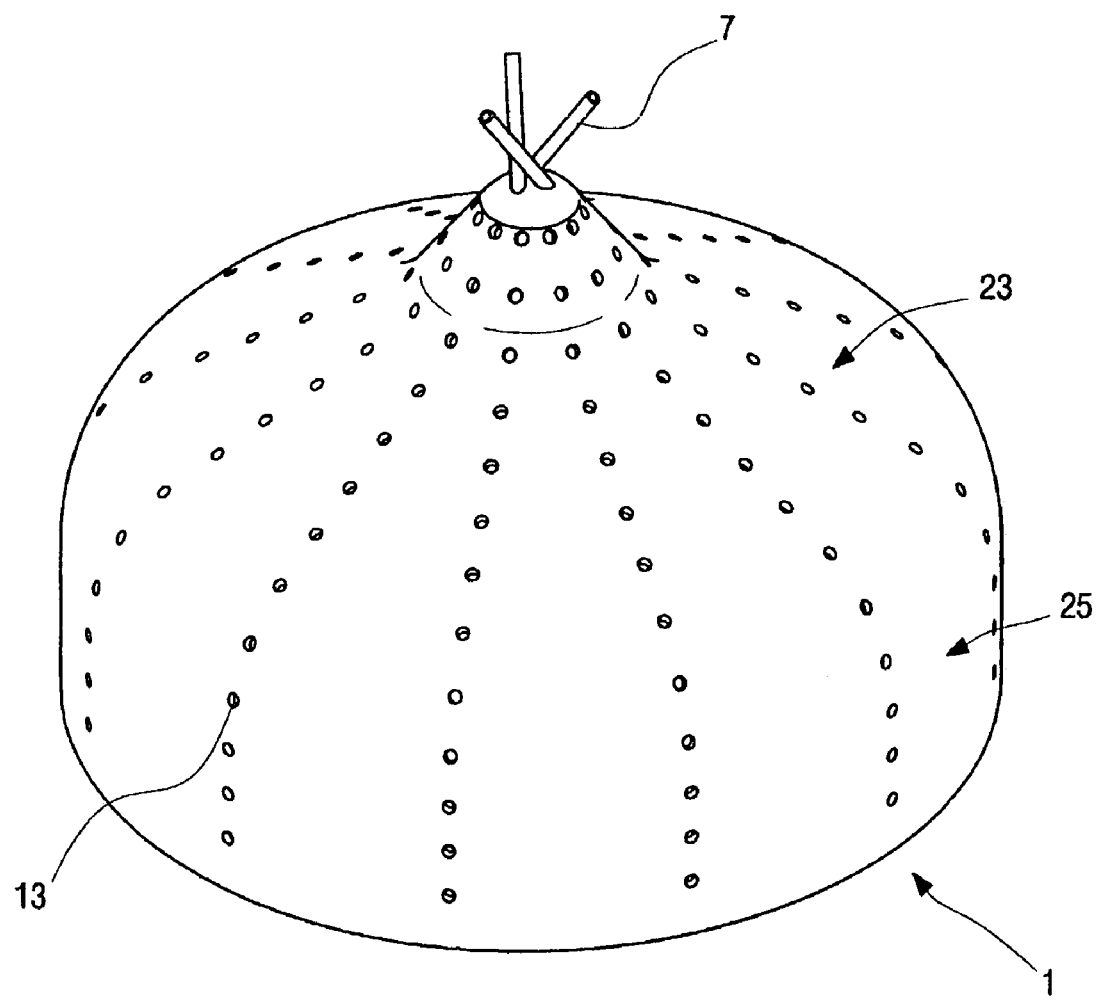
FIGS. 11 and 12 depict another examples of the reactive gas confining means in accordance with the invention.
Figure 12:
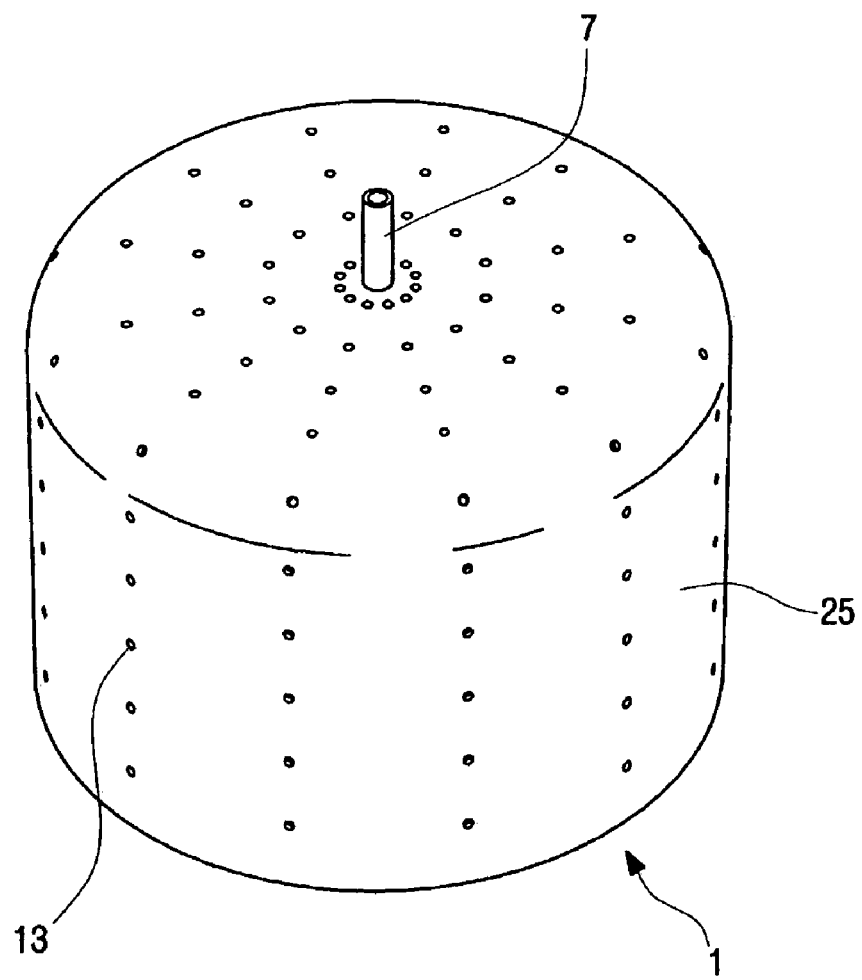
Figure 28:
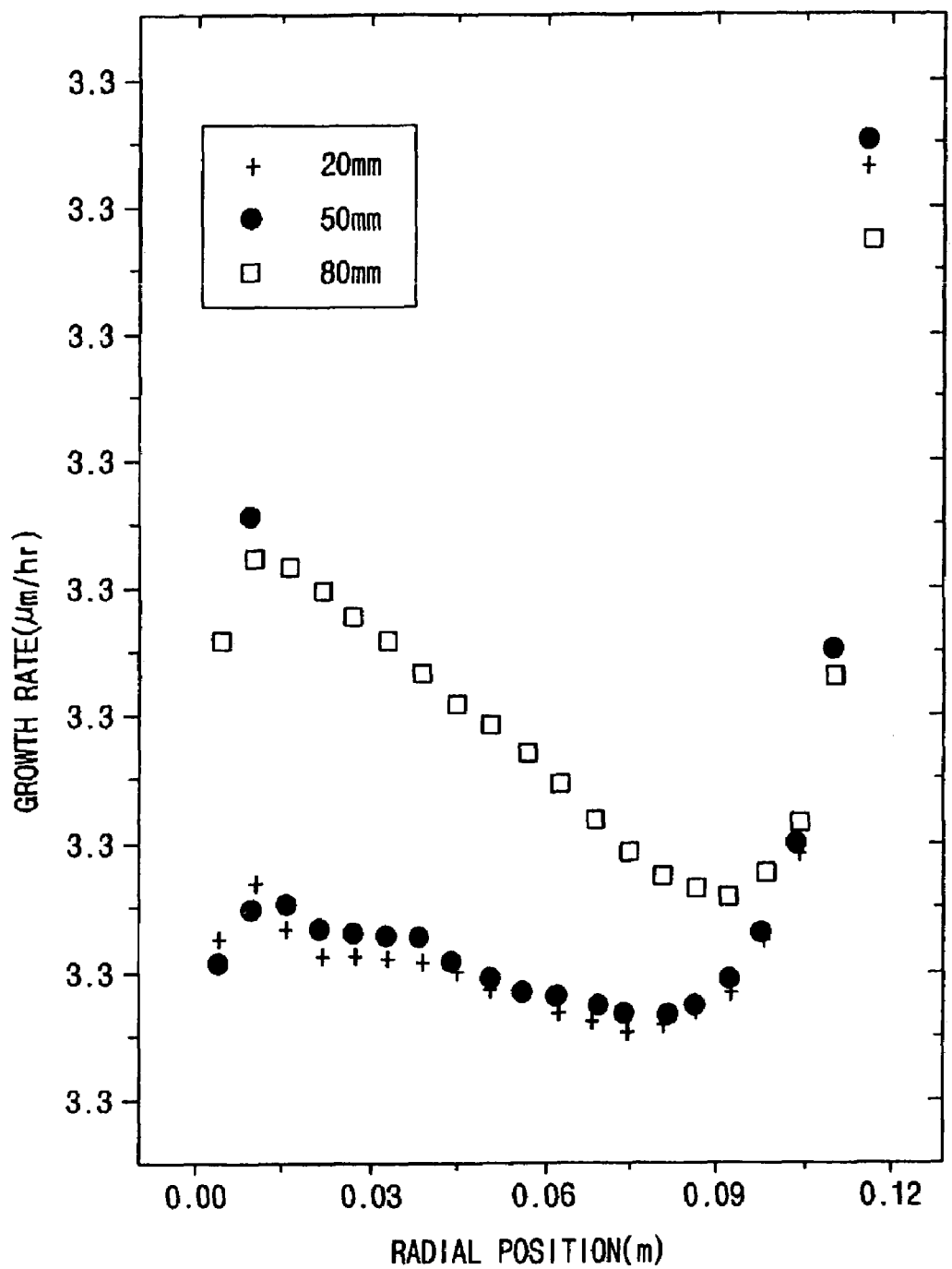
FIG. 28 is a graph showing variations of $TiO_2$ growth rate based on the heights of the susceptor in the reaction chamber according to another embodiment of the reactive gas confining means depicted in FIG. 7 of the present invention.

Finally, FIG. 28 is a graph showing variations of $TiO_2$ growth rate based on the 20 heights of the susceptor in the chamber 3 according to another embodiment of the means 1 having no mixing part depicted in FIG. 11. In this embodiment, the full height of the means is 300 mm and the other conditions are the same with that of Example 1. As shown in FIG. 28, it was noted that the film growth rates increases outstandingly, whereas, the uniformity of the film growth deteriorates more or less. That is, it teaches that, for securing the uniformity of the film growth, it is necessary to flatten the density contour of the source materials by increasing the length of the means 1 sufficiently. Accordingly, the axial length of the means 1 should be determined circumspectly in terms of both the structural efficiency and the uniformity of the film growth.

According to the present invention described above, it is possible to increase the density of the reactive gas using the effect of protective curtain caused by introducing the purge gas to the inside of the means 1 for confining the reactive gas in the midst of the reaction chamber 3 where the film growth is made, thus enhancing the film growth rate remarkably.

Besides, according to the effect of protective curtain of the invention, it is possible to prevent generation of contaminant particles on the inner wall of the reaction chamber 3.

Furthermore, according to another embodiment of the invention, there is provided a reactive gas confining means 1, of an appropriate size and shape that can surround the susceptor 5 in the reaction chamber 3, having the plural openings 13, perforated on the surface thereof, through which the purge gas is introduced. With the means 1, it is possible to prevent generation of contaminant particles on the surface of the means 1 using the effect of the protective curtain caused by the mutual diffusion-suppressing action between the reactive gas and purge gas by regulating the purge gas flow and the diffusion rate so as to introduce the purge gas, fed to the outside of the means 1, to the inside of the means 1.

Moreover, according to the reactive gas confining means 1 of the invention, it is possible to mix and diffuse the reactive gas rapidly and smoothly, and to prevent the natural convection caused by a temperature difference between the components in the reaction chamber thus enhancing the reproducibility, uniformity, controllability, and growth rate remarkably.

In addition, according to the invention, it is possible to increase noticeably the concentration of the reactive gas in the midst of the reaction chamber 3 where the film growth is made, without any losses of the reactive gas, compared with the conventional CVD apparatus, and to prevent generation of contaminant particles, which may be caused by the highly concentrated reactive gas, thus efficiently forming thick films more than 3 μm in thickness applied to the micro-electro mechanical system (MEMS), etc.

It will be apparent to those skilled in the art that various modifications and variations can be made in the method and apparatus for CVD capable of preventing contamination and enhancing film growth rate of the present invention without departing from the spirit or scope of the invention. Thus, it is intended that the present invention cover the modifications and variations of this invention provided they come within the scope of the appended claims and their equivalents.

What is claimed is:

1. A method for chemical vapor deposition (CVD) in a reaction chamber, a susceptor being located inside the reaction chamber, on which a substrate is placed and a film deposition is made as a result of chemical reactions with supplied source materials, the method comprising:

establishing a reactive gas confiner for surrounding the susceptor in the reaction chamber, the reactive gas confiner comprising a wall having a plurality of openings perforated for communication of inside with outside of the reactive gas confiner, wherein the wall of the reactive gas confiner is separated from the reaction chamber at a distance;

injecting a purge gas, which does not either dissolve or generate byproducts by itself, into an outside of the reactive gas confiner; and supplying a source material of vapor phase participating directly in forming a film to an inside of the reactive gas confiner, a protective curtain between the source material and the purge gas being formed in the reactive gas confiner.

2. The method for CVD as recited in claim 1, wherein the source material is a composition mixed with a main source material that participates directly in forming the film and an auxiliary source material for carrying, vaporizing or diluting the main source material.

3. The method for CVD as recited in claim 1, wherein the source material is composed of only main source material of pure vapor without a carrier gas.

4. The method for CVD as recited in claim 1, wherein the purge gas comprises at least one of Ar, $N_2$, He, $H_2$, $O_2$ gas, and a composition mixed with at least one of Ar, $N_2$, He, $H_2$, and $O_2$.

5. The method for CVD as recited in claim 1, wherein the reactive gas confiner has a plurality of openings through which the purge gas is introduced to the inside of the reactive gas confiner, thus preventing the source material from diffusing to the outside of the reactive gas confiner, and forming the protective curtain that prevents the source material from touching the reactive gas confiner.

6. The method for CVD as recited in claim 1, wherein an amount of the purge gas injected to the outside of the reactive gas confiner is set much larger than that of the source material supplied to the inside of the reactive gas confiner to direct the protective curtain from the outside to the inside of the reactive gas confiner, thus preventing the source material from touching the reactive gas confiner.

7. The method for CVD as recited in claim 5, wherein an amount of the purge gas injected to the outside of the reactive gas confiner is set much larger than that of the source material supplied to the inside of the reactive gas confiner to direct the protective curtain from the outside to the inside of the reactive gas confiner, thus preventing the source material from touching the reactive gas confiner.

* * * * *